United States Patent
Otsuka et al.

(10) Patent No.: US 7,791,852 B2
(45) Date of Patent: Sep. 7, 2010

(54) ELECTROSTATIC DISCHARGE PROTECTION CIRCUIT AND TERMINATING RESISTOR CIRCUIT

(75) Inventors: Kanji Otsuka, 1074-38, Kohan 2-chome, Higashiyamato-shi, Tokyo 207-0002 (JP); Tamotsu Usami, 38-4, Nishimachi 2-chome, Kokubunji-shi, Tokyo 185-0035 (JP); Yutaka Akiyama, 120-12, Katakuramachi, Hachiouji-shi, Tokyo 192-0914 (JP); Tsuneo Ito, 762-3, Futamatao 3-chome, Oume-shi, Tokyo 198-0171 (JP); Yuko Tanba, 45-5, Shinmachi 1-chome, Oume-shi, Tokyo 198-0024 (JP)

(73) Assignees: Kanji Otsuka, Tokyo (JP); Tamotsu Usami, Tokyo (JP); Yutaka Akiyama, Tokyo (JP); Tsuneo Ito, Tokyo (JP); Yuko Tanba, Tokyo (JP); Fujitsu Microelectronics Limited, Yokohama (JP); OKI Semiconductor Co., Ltd., Tokyo (JP); Kyocera Corporation, Kyoto (JP); Kabushiki Kaisha Toshiba, Tokyo (JP); Fuji Xerox Co., Ltd., Tokyo (JP); Renesas Technology Corp, Tokyo (JP)

( * ) Notice: Subject to any disclaimer, the term of this patent is extended or adjusted under 35 U.S.C. 154(b) by 390 days.

(21) Appl. No.: 11/819,579

(22) Filed: Jun. 28, 2007

(65) Prior Publication Data
US 2008/0042686 A1      Feb. 21, 2008

(30) Foreign Application Priority Data
Jun. 28, 2006   (JP)   ............................. 2006-177842

(51) Int. Cl.
*H02H 3/22* (2006.01)
(52) U.S. Cl. ........................ 361/56; 361/111
(58) Field of Classification Search ................... 361/56, 361/111
See application file for complete search history.

(56) References Cited

U.S. PATENT DOCUMENTS

| | | | |
|---|---|---|---|
| 6,815,980 B2* | 11/2004 | Kerr | 326/30 |
| 2005/0040846 A1* | 2/2005 | Otsuka et al. | 326/31 |
| 2007/0290713 A1* | 12/2007 | Ding et al. | 326/30 |

FOREIGN PATENT DOCUMENTS

JP       2004-071991 A       3/2004

* cited by examiner

*Primary Examiner*—Danny Nguyen
(74) *Attorney, Agent, or Firm*—Arent Fox LLP

(57) ABSTRACT

Disclosed is an electrostatic discharge protection circuit capable of realizing speeding up of differential signals by reducing a capacitance of the circuit. Transmission lines are connected to an IN terminal and an IN Bar terminal and differential signals are input to the terminals. The ESD protection circuit is connected to the transmission lines and protects an internal circuit from a surge voltage applied to the IN terminal and the IN Bar terminal. A pair of transistors of the ESD protection circuit is formed in the same well. Thereby, when differential signals transit, charges in drains of the pair of transistors holding a state before a transition transfer in the same well. As a result, the capacitances in the drains of the pair of transistors are reduced with respect to the transition of differential signals so that the speeding up of differential signals can be realized.

6 Claims, 23 Drawing Sheets

| INPUT VOLTAGE | M1 | M2 | S1 | S2 | D1 | D2 |
|---|---|---|---|---|---|---|
| Over VDD | ON | ON | VDD | VDD | V↗ | V↗ |
| H/L | OFF | OFF | VDD | VDD | VDD | GND |
| L/H | OFF | OFF | VDD | VDD | GND | VDD |

FIG. 7

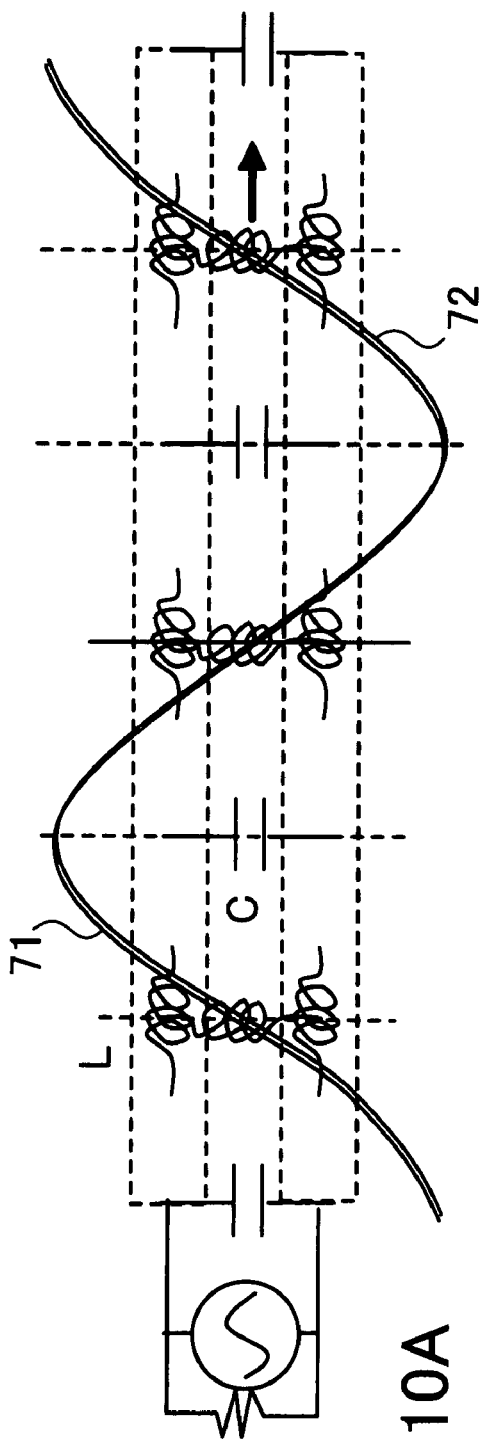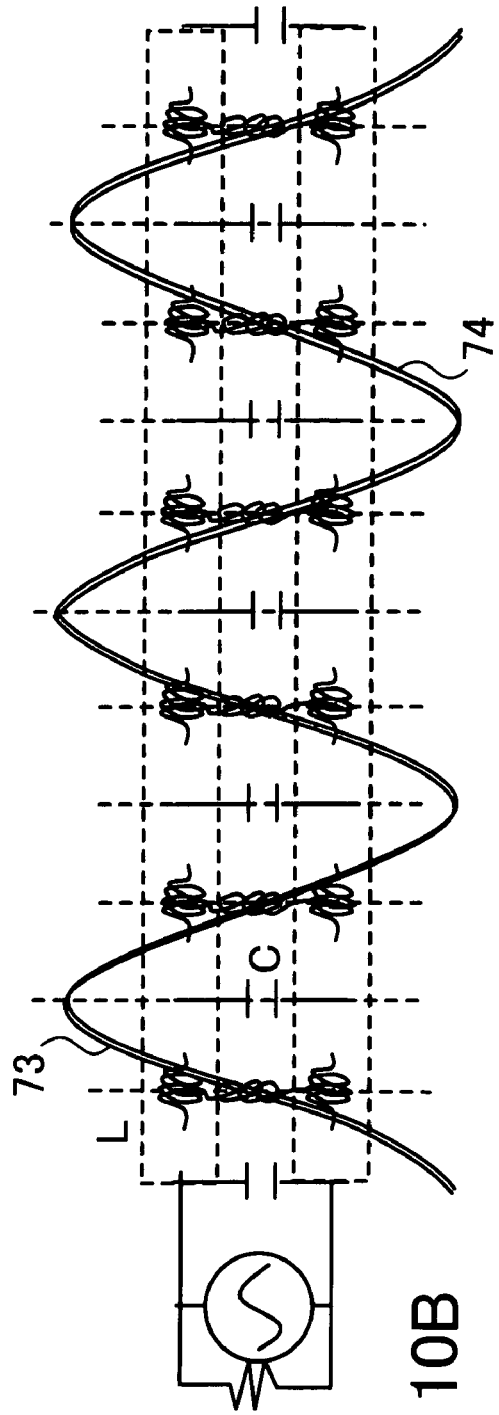
FIG. 10A
FIG. 10B

ELECTROSTATIC DISCHARGE PROTECTION CIRCUIT AND TERMINATING RESISTOR CIRCUIT

CROSS-REFERENCE TO RELATED APPLICATIONS

This application is based upon and claims the benefits of priority from the prior Japanese Patent Application No. 2006-177842, filed on Jun. 28, 2006, the entire contents of which are incorporated herein by reference.

BACKGROUND OF THE INVENTION

1. Field of the Invention

The present invention relates to an electrostatic discharge protection circuit and a terminating resistor circuit. Particularly, the present invention relates to an electrostatic discharge protection circuit for protecting an internal circuit of a semiconductor device from electrostatic discharge. The invention also pertains to a terminating resistor circuit for stabilizing signals of a semiconductor device.

2. Description of the Related Art

An internal circuit of an LSI may be damaged by Electro Static Discharge (ESD) due to contact with a person and friction with a storage box. In order to protect the internal circuit from ESD, the LSI has an ESD protection circuit between a power supply terminal and a signal input/output terminal.

This ESD protection circuit has a capacitance due to transistors in the input stage for inputting voltage surge and causes RC delays or ZC delays in differential signals to be input/output to LSI terminals. Therefore, in the LSI which guarantees switching operations (pulse rise time: tr=500 ps to 1 ns) at several hundred MHz, the ESD protection circuit hinders the high-speed property of the internal circuit. Here, assume that a characteristic impedance ($Z_0$) of a transmission line in the LSI inside is 100Ω and a capacitance (C) of the ESD protection circuit is 1 to 4 pF. In this case, a time constant at the LSI terminal is $Z_0C$=100 to 400 ps and is just barely smaller than the pulse rise time tr so that a normal ESD protection circuit can still be used.

However, in LSIs (pulse rise time: tr=50 to 200 ps) improved in clock frequency and operating at several GHz, when a capacitance of the ESD protection circuit is 1 to 4 pF as described above, the time constant of the LSI terminal is larger than the pulse rise time.

As a result, an LSI slew rate during the switching is determined by the ESD protection circuit and reaches a peak with an operation at below 1 GHz.

In addition, there is conventionally proposed a semiconductor integrated circuit device for equalizing an ESD load imposed on each protection element within a protection circuit, and preventing the destruction of a transistor for protecting an internal circuit (see, e.g., Japanese Unexamined Patent Application Publication No. 2004-71991).

Thus, there is a problem that due to capacitance of the electrostatic discharge protection circuit, differential signals are delayed so that the speeding up of differential signals is difficult.

Also when a terminating resistor circuit is connected to a signal line through which differential signals propagate, there is a problem that due to parasitic capacitance of the terminating resistor circuit, differential signals are delayed so that speeding up of differential signals is difficult.

SUMMARY OF THE INVENTION

In view of the foregoing, it is an object of the present invention to provide an electrostatic discharge protection circuit capable of realizing speeding up of differential signals by reducing a capacitance of the circuit. It is another object of the present invention to provide a terminating resistor circuit capable of realizing speeding up of differential signals by reducing a capacitance of the circuit.

To accomplish the above objects, according to one aspect of the present invention, there is provided an electrostatic discharge protection circuit for protecting an internal circuit of a semiconductor device from electrostatic discharge. This circuit comprises: a pair of transistors connected to each of two lines which are connected to external terminals of the semiconductor device and through which differential signals propagate, the pair of transistors being formed in the same well so as to clamp the electrostatic discharge applied to the external terminals.

According to another aspect of the present invention, there is provided a terminating resistor circuit for stabilizing differential signals in a semiconductor device. This circuit comprises: a pair of resistances connected to each of two lines which are connected to external terminals of the semiconductor device and through which differential signals propagate, the pair of resistances being formed in the same well so as to prevent reflection of the differential signals.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 2A shows a pair coplanar line and FIG. 2B shows a stacked pair line.

FIG. 3A illustrates charge transfer between the transistors of a conventional ESD protection circuit. FIG. 3B illustrates charge transfer between a pair of transistors of the ESD protection circuit 11 in FIG. 1.

FIG. 7 illustrates operations of the pair of transistors in FIG. 6.

FIGS. 10A and 10B each are a model view in the case where a resistance and conductance in FIG. 9 are set to zero.

DESCRIPTION OF THE PREFERRED EMBODIMENTS

Figure 1:
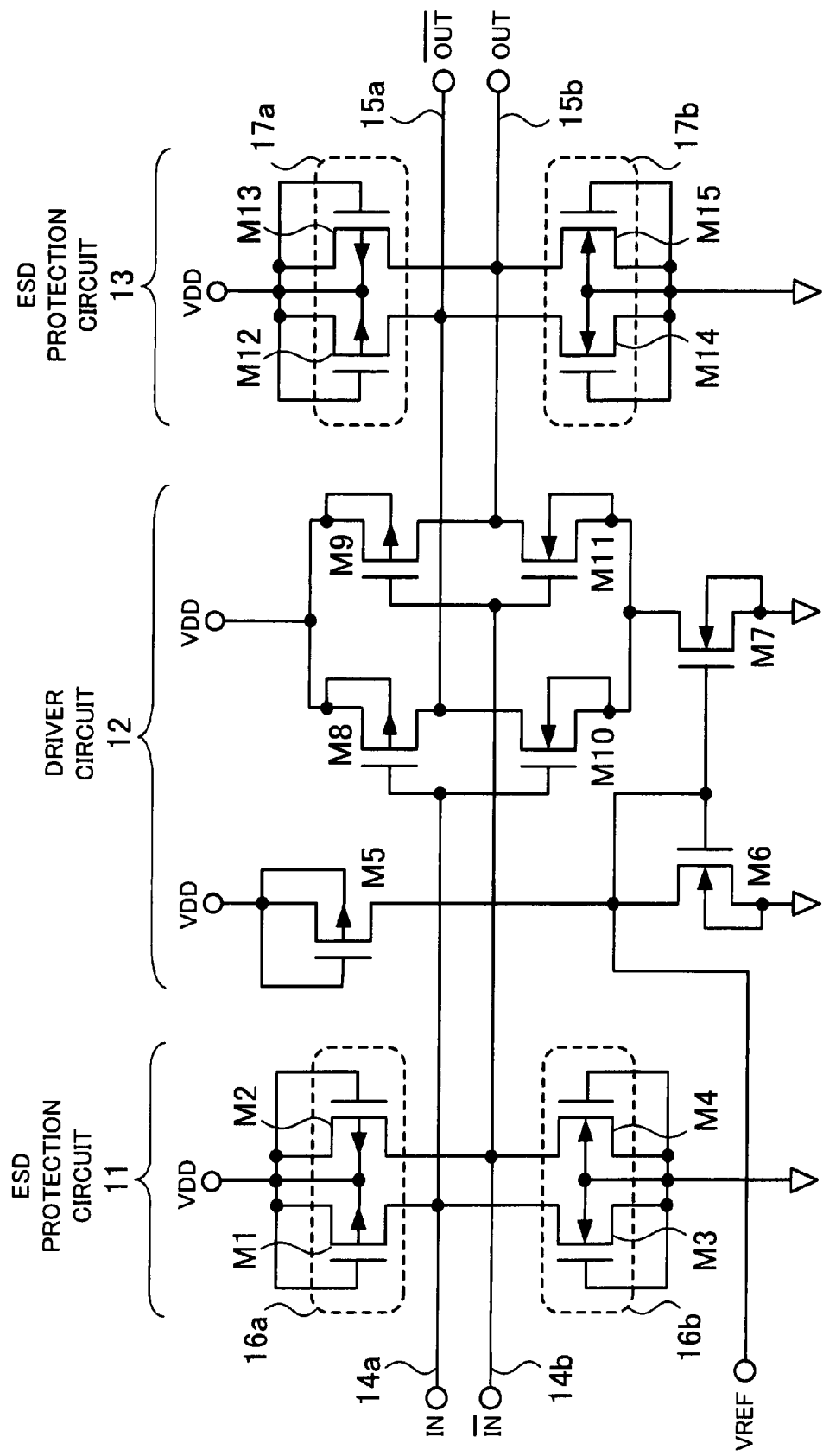
FIG. 1 is a circuit diagram of an LSI using an ESD protection circuit according to a first embodiment.

A first embodiment of the present invention will be described in detail below with reference to the accompanying drawings, wherein like reference numerals refer to like elements throughout.

FIG. 1 is a circuit diagram of an LSI using an ESD protection circuit according to the first embodiment. As shown in FIG. 1, the LSI has ESD protection circuits 11 and 13, a driver circuit 12, transmission lines 14a, 14b, 15a and 15b, an IN terminal, an IN Bar terminal (a terminal indicated by IN having a line thereover), an OUT terminal, and an OUT Bar terminal (a terminal indicated by OUT having a line thereover).

The IN terminal and the IN Bar terminal are external terminals of the LSI. To the terminals, differential signals are input from the outside. The IN terminal and the IN Bar terminal are connected to the transmission lines 14a and 14b as a differential pair line. Through the lines 14a and 14b, the IN terminal and the IN Bar terminal are connected to the driver circuit 12.

The OUT terminal and the OUT Bar terminal are external terminals of the LSI and connected to the transmission lines 15a and 15b as a differential pair line. Through the lines 15a and 15b, the OUT terminal and the OUT Bar terminal are connected to the driver circuit 12 to externally output differential signals output from the driver circuit 12.

The ESD protection circuit 11 is connected to the transmission lines 14a and 14b. The circuit 11 protects an internal circuit of the LSI from a surge voltage applied to the IN terminal and the IN Bar terminal. The ESD protection circuit 13 is connected to the transmission lines 15a and 15b. The circuit 13 protects an internal circuit of the LSI from a surge voltage applied to the OUT terminal and the OUT Bar terminal.

The drive circuit 12 drives differential signals input to the IN terminal and the IN Bar terminal as well as outputs the differential signals to the OUT terminal and the OUT Bar terminal. The LSI shown in FIG. 1 is an example of a repeater circuit in which differential signals input to the IN terminal and the IN Bar terminal are driven by the driver circuit 12 and output to the OUT terminal and the OUT Bar terminal. Between the ESD protection circuits 11 and 13, for example, a circuit for processing the differential signals may exist.

The ESD protection circuit 11 has a pair of PMOS transistors M1, M2 and a pair of NMOS transistors M3, M4. Gates of the pair of transistors M1, M2 are connected to each other and connected to a power supply VDD. Sources of the pair of transistors M1, M2 are connected to each other and connected to a power supply VDD. Back gates of the pair of transistors M1, M2 are connected to each other and connected to a power supply VDD. A drain of the transistor M1 is connected to the transmission line 14a and a drain of the transistor M2 is connected to the transmission line 14b.

Gates of the pair of transistors M3, M4 are connected to each other and connected to ground. Sources of the pair of transistors M3, M4 are connected to each other and connected to ground. Back gates of the pair of transistors M3, M4 are connected to each other and connected to ground. A drain of the transistor M3 is connected to the transmission line 14a and a drain of the transistor M4 is connected to the transmission line 14b.

The ESD protection circuit 13 has a pair of PMOS transistors M12, M13 and a pair of NMOS transistors M14, M15. The pair of transistors M12, M13 corresponds to the pair of transistors M1, M2 of the ESD protection circuit 11. The pair of transistors M14, M15 corresponds to the pair of transistors M3, M4 of the ESD protection circuit 11. Detailed descriptions of the transistors are omitted.

In the ESD protection circuit 11, the pair of transistors M1, M2 is formed in the same well. Further, the pair of transistors M3, M4 is formed in the same well. Also in the ESD protection circuit 13, the pair of transistors M12, M13 is formed in the same well. Further, the pair of transistors M14, M15 is formed in the same well. In FIG. 1, a dotted line 16a indicates that the pair of transistors M1, M2 is formed in the same well, and a dotted line 16b indicates that the pair of transistors M3, M4 is formed in the same well. Further, a dotted line 17a indicates that the pair of transistors M12, M13 is formed in the same well, and a dotted line 17b indicates that the pair of transistors M14, M15 is formed in the same well.

The transistors M1 to M4 of the ESD protection circuit 11 realize a clamping function. When a surge voltage in excess of a voltage of the power supply VDD is input to the transmission lines 14a and 14b, the pair of transistors M1, M2 is turned on to protect the internal circuit (the driver circuit 12 in the example of FIG. 1) of the LSI. When a surge voltage lower than the voltage of ground is input to the transmission lines 14a and 14b, the pair of transistors M3, M4 is turned on to protect the internal circuit of the LSI. The transistors M12 to M15 of the ESD protection circuit 13 similarly realize a clamping function for the surge voltage input to the transmission lines 15a and 15b.

The transistors M1 to M4 of the ESD protection circuit 11 each have a drain capacitance. Therefore, for example, when a differential signal of the transmission line 14a switches (inverts) from the H level to the L level or when a differential signal of the transmission line 14b switches (inverts) from the L level to the H level, the charge exchange occurs between the drains and as a result, a delay of the differential signal is caused. However, as described above, since each pair of transistors M1, M2 and transistors M3, M4 is formed in the same well, the following phenomena occur. For example, when the transmission line 14a switches from the H level to the L level or when the transmission line 14b switches from the L level to the H level, electrons from the drain of the transistor M2 transfer to the drain of the transistor M1 through the same well and therefore, the drain capacitances of the pair of transistors M1, M2 are reduced with respect to the switching of the differential signal. Similarly, the drain capacitances of the pair of transistors M3, M4 are also reduced with respect to the switching of the differential signal. As a result, the delay of the differential signal is suppressed so that speeding up of the LSI can be attained. Likewise also in the ESD protection circuit 13, since each pair of transistors M12, M13 and transistors M14, M15 is formed in the same well, the following phenomena occur. That is, the drain capacitances of each pair of transistors M12, M13 and transistors M14, M15 are reduced with respect to the switching of the differential signal of the transmission lines 15a and 15b.

The driver circuit 12 has PMOS transistors M5, M8 and M9 and NMOS transistors M6, M7, M10 and M11. A gate, source and back gate of the transistor MS are connected to the power supply VDD. A drain of the transistor MS is connected to that of the transistor M6. A gate of the transistor M6 is connected to that of the transistor M7. To the gates of the transistors M6 and M7 and to the drains of the transistors MS and M6, a voltage VREF is input. A source and back gate of the transistor M6 are connected to ground. A source and back gate of the transistor M7 are connected to ground. A drain of the transistor M7 is connected to sources of the transistors M10 and M11.

Gates of the transistors M8 and M10 are connected to each other and connected to the transmission line 14a. Drains of the transistors M8 and M10 are connected to each other and connected to the transmission line 15a. A source and back gate of the transistor M8 are connected to the power supply VDD. A source and back gate of the transistor M10 are connected to the drain of the transistor M7. Gates of the transistors M9 and M11 are connected to each other and connected to the transmission line 14b. Drains of the transistors M9 and M11 are connected to each other and connected to the transmission line 15b. A source and back gate of the transistor M9 are connected to the power supply VDD. A source and back gate of the transistor M11 are connected to the drain of the transistor M7.

The transistors M8 and M10 and the transistors M9 and M11 constitute an inverter circuit. The transistors M8 and M10 invert a signal of the transmission line 14a and output the inverted signal to the transmission line 15a. The transistors M9 and M11 invert a signal of the transmission line 14b and output the inverted signal to the transmission line 15b.

The transistors M5 to M7 constitute a constant current circuit. Depending on the voltage VREF, the transistors M5 to M7 control a current flowing into the sources of the transistors M10 and M11. Therefore, by controlling the voltage VREF, the driving ability of the inverter circuit including the transistors M8 and M10 and the transistors M9 and M11 can be controlled.

The operations of FIG. 1 will be described below. The differential signals input to the IN terminal and the IN Bar terminal are output to the OUT terminal and the OUT Bar terminal through the transmission lines 14a and 14b, the driver circuit 12 and the transmission lines 15a and 15b.

To the transmission lines 14a and 14b, the ESD protection circuit 11 for protecting the driver circuit 12 from a surge voltage is connected. In the ESD protection circuit 11, since each pair of transistors M1, M2 and transistors M3, M4 is formed in the same well, the drain capacitances of each pair of transistors M1, M2 and transistors M3, M4 are reduced with respect to the switching of the differential signal input to the IN terminal and the IN Bar terminal. As a result, the delay of the differential signal is suppressed. Likewise also in the ESD protection circuit 13, since each pair of transistors M12, M13 and transistors M14, M15 is formed in the same well, the drain capacitances of each pair of transistors M12, M13 and transistors M14, M15 are reduced with respect to the switching of the differential signal output to the OUT terminal and the OUT Bar terminal. As a result, the delay of the differential signal is suppressed.

Meanwhile, when a surge voltage is input to the IN terminal and the IN Bar terminal, the transistors M1 to M4 are turned on. As a result, a channel is formed in the transistors M1 to M4, whereby the drain capacitance increases and the surge voltage is absorbed. Likewise, when a surge voltage is input to the OUT terminal and the OUT Bar terminal, the transistors M12 to M15 are turned on. As a result, a channel is formed in the transistors M12 to M15, whereby the drain capacitance increases and the surge voltage is absorbed.

Thus, when each pair of transistors M1, M2 and transistors M3, M4 constituting the ESD protection circuit 11 is formed in the same well as well as each pair of transistors M12, M13 and transistors M14, M15 constituting the ESD protection circuit 13 is formed in the same well, the drain capacitance is reduced with respect to the switching of the differential signals so that the delay of the differential signal can be suppressed. As a result, speeding up of the LSI can be attained.

Next, examples of a differential pair line applied to the transmission lines 14a and 14b, and to the transmission lines 15a and 15b will be described.

Figure 2A:
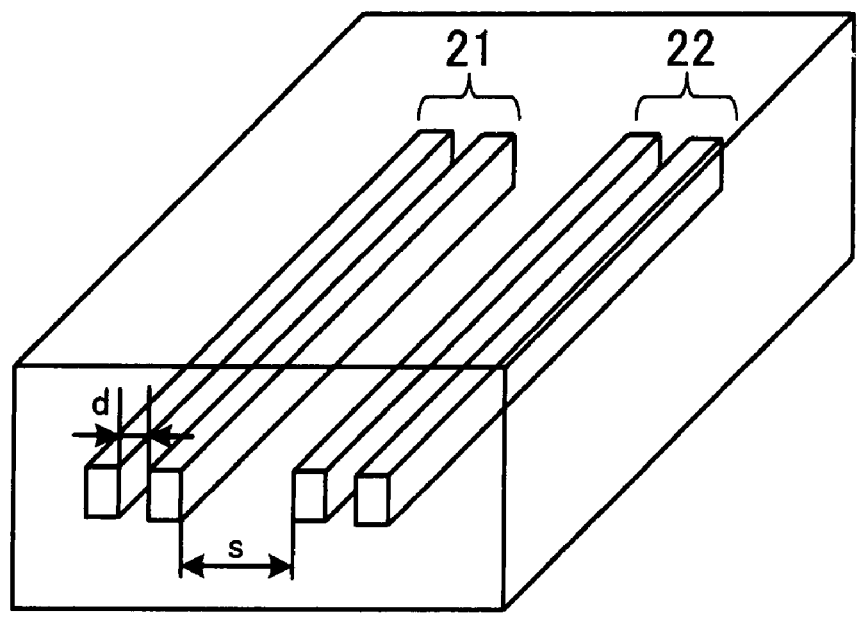
FIGS. 2A and 2B show a differential pair line.
Figure 2B:
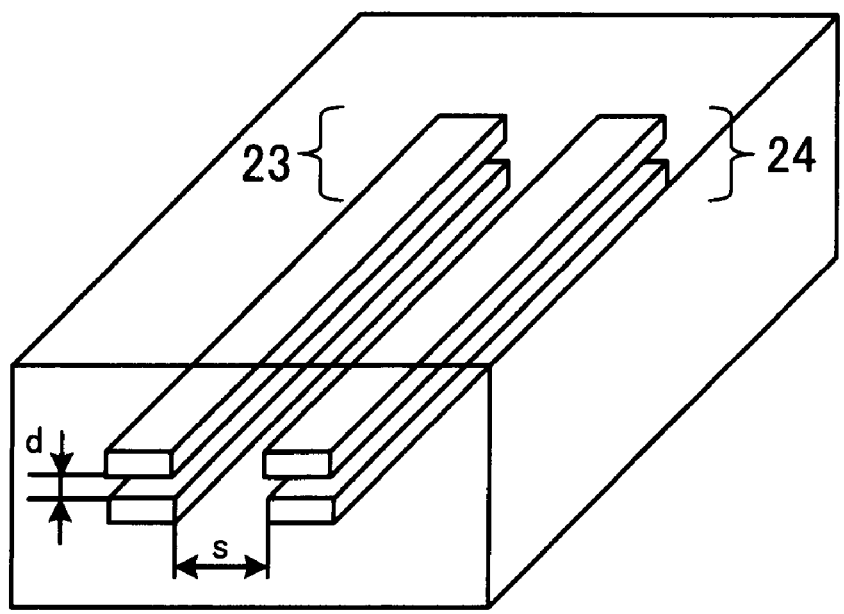

FIG. 2 shows the differential pair line. FIG. 2A shows a pair coplanar line and FIG. 2B shows a stacked pair line.

The pair lines 21 and 22 shown in FIG. 2A are formed in homogeneous insulating materials. The pair line 21 transmits differential signals through two lines. For example, the transmission lines 14a and 14b in FIG. 1 correspond to the pair line 21.

The pair line 22 similarly transmits differential signals through two lines. Assuming that a distance between the opposing surfaces of the pair line 21 is designated as "d" and a distance between the pair line 21 and the adjacent pair line 22 is designated as "s", a relationship between the above distances "d" and "s" is preferably set to $2d \leqq s$.

Likewise, the pair lines 23 and 24 shown in FIG. 2B are formed in homogeneous insulating materials. The pair line 23 transmits differential signals through two lines. For example, the transmission lines 14a and 14b in FIG. 1 correspond to the pair line 23. The pair line 24 similarly transmits differential signals through two lines. Assuming that a distance between the opposing surfaces of the pair line 23 is designated as "d" and a distance between the pair line 23 and the adjacent pair line 24 is designated as "s", a relationship between the above distances "d" and "s" is preferably set to $2d \geqq s$.

Thus, when the stacked pair line or the pair coplanar line is applied to the transmission lines 14a and 14b, and to the transmission lines 15a and 15b, crosstalk is suppressed so that high-speed transmission of the differential signals can be attained. In addition, the pair lines 23 and 24 as shown in FIG. 2B play an important role also in the absorption of a surge voltage, as described in detail later.

Next, the charge transfer between the transistors of the ESD protection circuits 11 and 13 will be described.

In transistors (e.g., each pair of transistors M1, M2 and transistors M3, M4 of FIG. 1 which is not formed in the same well) of the conventional ESD protection circuit, when the differential signal transits, the held charge is discharged and the new charge is induced through the transmission lines immediately before the transition. Therefore, a time is required to form a charge distribution after the transition. As a result, a delay of the differential signal occurs. Accordingly, if the drain capacitance of the transistor for clamping a surge voltage is reduced, this problem is relieved; however, a relation of trade-off is caused with respect to the effects of the ESD. Therefore, it is difficult to reduce the drain capacitance of the transistor.

Meanwhile, when the surge voltage is applied to the terminal of the LSI, if excess charges can be instantaneously discharged to a power supply or ground so as to allow the charges to be absorbed into bypass capacitors formed within the LSI, the drain capacitance of the transistor of the ESD protection circuit can be reduced. However, when an inductance is present in the transmission line, the surge voltage is prevented from being instantaneously discharged. Therefore, by the delay due to the inductance, noise charges arrive at the internal circuit and as a result, electrostatic breakdown occurs.

Therefore, the conventional ESD protection circuit is designed such that the transistor itself for clamping the surge voltage has a capacity as large as 1 pF to 4 pF and diffuses the surge voltage into the capacity as well as discharges the surge voltage to the power supply or ground to thereby reduce the surge voltage. This operation is substantially a passive operation and is not an operation where noise charges are positively discharged by the transistor for performing an active change. This operation is performed as follows. That is, the transistor turns on or breaks down due to the surge voltage and then, discharges the noise charges to the power source or the ground to thereby reduce the surge voltage. If nothing is done, it is impossible, in principle, to reduce the capacity of the clamp transistor.

Meanwhile, when each differential pair of transistors M1, M2 and transistors M3, M4 which are facing in a complementary style as shown in FIG. 1 is disposed in the same well, the charges stored in the respective drain diffusion layer capacitances transfer to each other through the well so as to be reused. As a result, an effect of substantially reducing the drain capacitance is obtained with respect to the differential signal so as to contribute to the improvement in the slew rate of the differential signal. This principle will be described below with reference to the accompanying drawings.

Figure 3A:
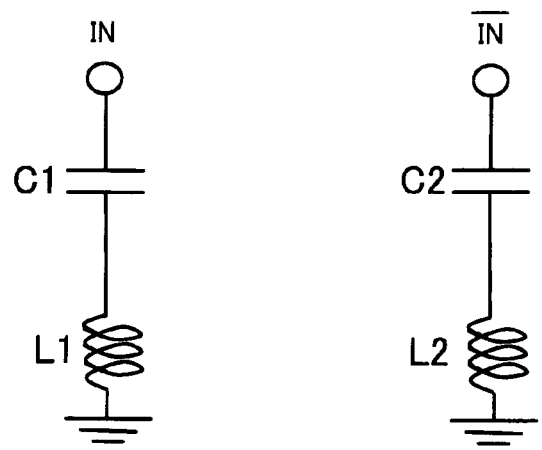
FIGS. 3A and 3B illustrate charge transfer between a pair of transistors of the ESD protection circuit.
Figure 3B:
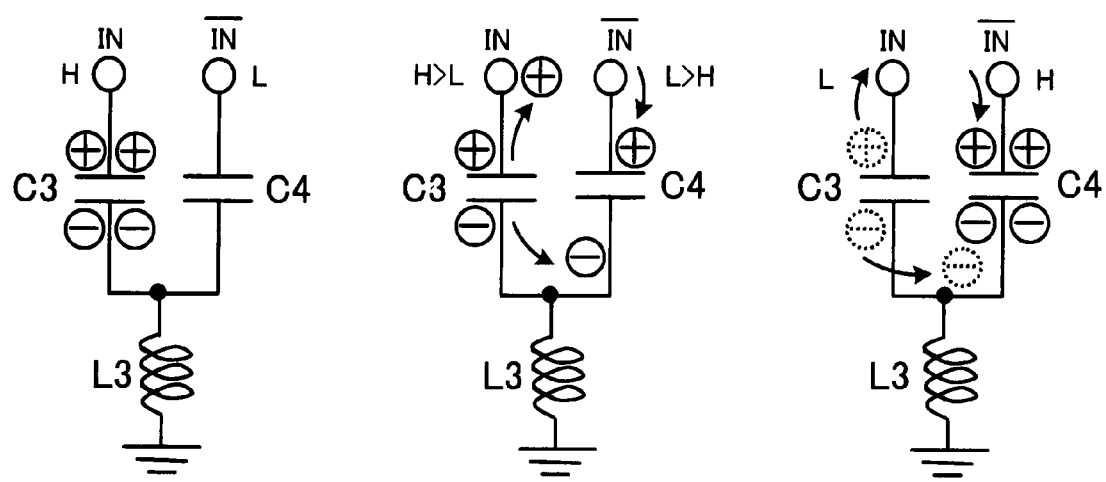

FIG. 3 illustrates the charge transfer between the transistors of the ESD protection circuit. FIG. 3A illustrates the charge transfer between the transistors of the conventional ESD protection circuit. FIG. 3B illustrates the charge transfer between the transistors of the ESD protection circuit 11 in FIG. 1.

Capacitors C1 and C2 shown in FIG. 3A represent drain capacitances in the case where the pair of transistors M3, M4 of the ESD protection circuit 11 in FIG. 1 is not formed in the same well. An IN terminal and IN Bar terminal in FIG. 3A correspond to the IN terminal and IN Bar terminal in FIG. 1. To these terminals, the differential signal is input. Parasitic inductances L1 and L2 represent an inductance for limiting an instantaneous current. It can be considered that when the pair of transistors M3, M4 is not formed in the same well, a distance between two capacitors representing the drain capacitances of the pair of transistors M3, M4 is sufficiently apart from each other as shown in FIG. 3A.

Capacitors C3 and C4 shown in FIG. 3B represent drain capacitances in the case where the pair of transistors M3, M4 of the ESD protection circuit 11 in FIG. 1 is formed in the same well. An IN terminal and IN Bar terminal in FIG. 3B correspond to the IN terminal and IN Bar terminal in FIG. 1. To these terminals, the differential signal is input. An inductance L3 represents an inductance for limiting an instantaneous current.

It can be considered that when the pair of transistors M3, M4 is formed in the same well, each one end of the capacitors C3 and C4 representing the drain capacitances of the pair of transistors M3, M4 is connected to each other as shown in FIG. 3B. Here, assume that the IN terminal transits from the H level to the L level and the IN Bar terminal transits from the L level to the H level.

It can be considered that when the IN terminal is at the H level and the IN Bar terminal is at the L level, charges are held in the capacitor C3 as in a model shown on the left side of FIG. 3B. Starting from this state, when the IN terminal transits to the L level and the IN Bar terminal transits to the H level, a positive charge in the capacitor C3 returns to the IN terminal and a positive charge is supplied to the capacitor C4 from the IN Bar terminal as in a model shown in the middle of FIG. 3B. Further, electrons held in the capacitor C3 transfer to the capacitor C4 through the well. Then, the charge transfer to the capacitor C4 is completed as in a model shown on the right side of FIG. 3B.

Thus, in the inversion of the differential signal, the charges transfer through the well. Thereby, the drain capacitances of the pair of transistors M3, M4 are artificially reduced so that a delay in the switching of the differential signal can be suppressed. That is, ESD measures are made possible responding to speeding up of the differential signals.

Here, a transfer time of positive charges (holes) between the drains of the pair of transistors M3, M4 is calculated. Assuming that a mobility of holes is $4 \times 10^2$ [cm$^2$] (temperature: 300K, carrier concentration: $10^{14}$ to $10^{15}$ [cm$^{-3}$]) and a voltage of the power supply VDD is 1.8 V, a drift diffusion rate D is $D=7.2 \times 10^2$ [cm$^2$/s]. Assuming that a mean dimension of carrier transfer is 1 μm and a time required for carriers to transfer along the mean dimension 1 is t, the equation $0.0001$ cm$=(D \cdot t)^{1/2}=(7.2 \times 10^2 \cdot t)^{1/2}$ holds. Accordingly, the transfer time of $t=0.014 \times 10^{-9}$ s=0.014 ns is obtained. In the case where carriers are electrons, the time t is about 14 (ps).

A distance between the drains of the pair of transistors M3, M4 must be determined such that a transfer time of charges is shorter than a transition time of the differential signal input to the LSI. As in the above example, when the transition time bandwidth of the input differential signal is in the order of GHz, a distance between the drains of the pair of transistors M3, M4 must be up to 1 μm.

Next, there will be described a structural example of each pair of transistors M1, M2, transistors M3, M4, transistors M12, M13 and transistors M14, M15, which is formed in the same well. In the following, the pair of transistors M3, M4 will be described. A structure of each pair of transistors M1, M2, transistors M12, M13, and transistors M14, M15 is the same as that of the pair of transistors M3, M4 and therefore, the detailed description is omitted.

Figure 4:
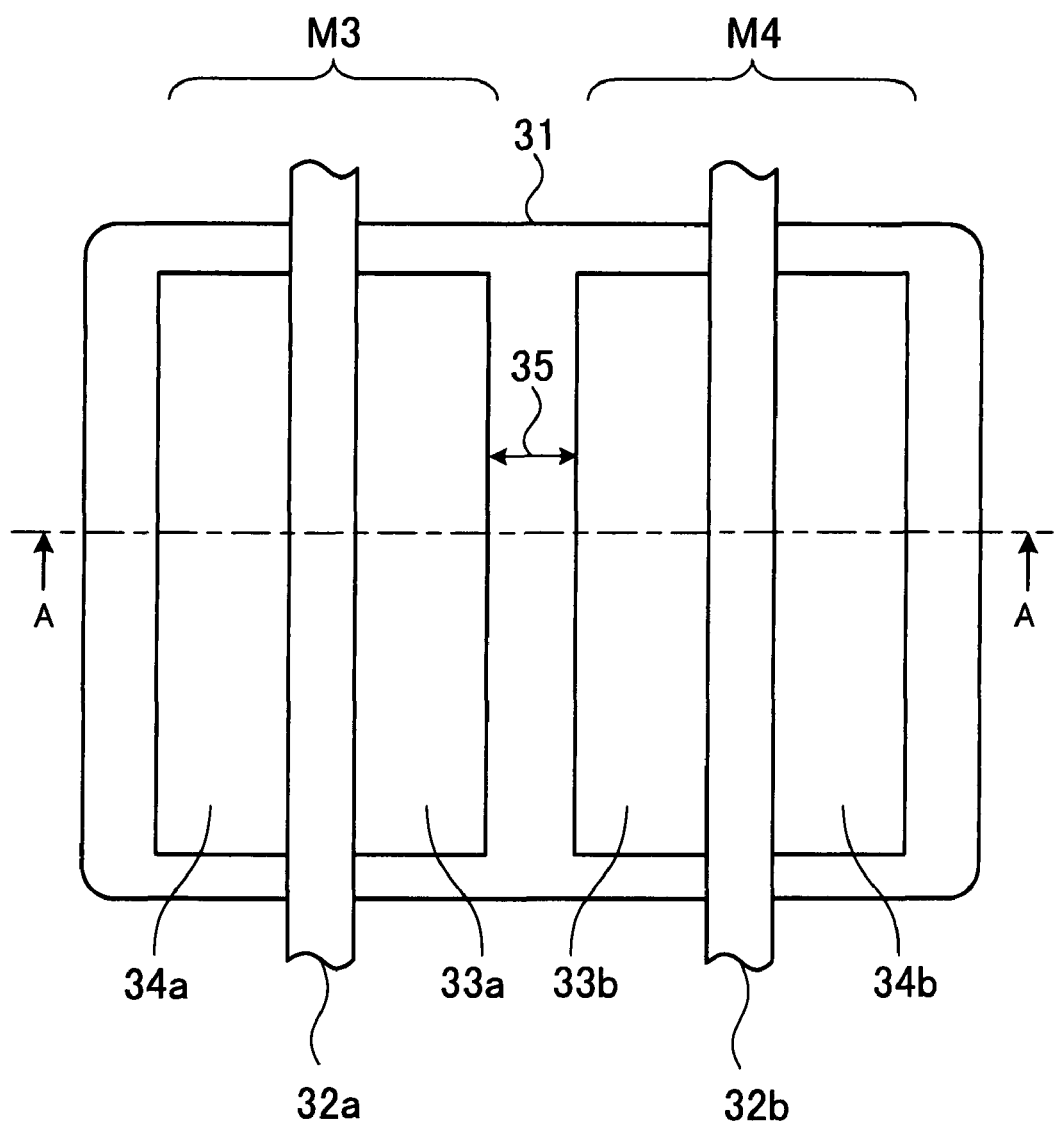
FIG. 4 is a plan view of a pair of transistors formed in the same well.

FIG. 4 is a plan view of a pair of transistors formed in the same well. As shown in FIG. 4, a drain diffusion layer 33a and source diffusion layer 34a of the transistor M3 are formed in a well 31. A gate electrode 32a of the transistor M3 is formed over the well 31. Similarly, a drain diffusion layer 33b and source diffusion layer 34b of the transistor M4 are formed in the well 31. A gate electrode 32b of the transistor M4 is formed over the well 31. The gate electrodes 32a and 32b and the source diffusion layers 34a and 34b are connected to ground. The drain diffusion layers 33a and 33b are connected to the transmission lines 14a and 14b. A distance between the drain diffusion layers 33a and 33b indicated by the double arrow 35 of FIG. 4 is determined such that the transfer time of charges is shorter than the transition time of the differential signals.

Figure 5:
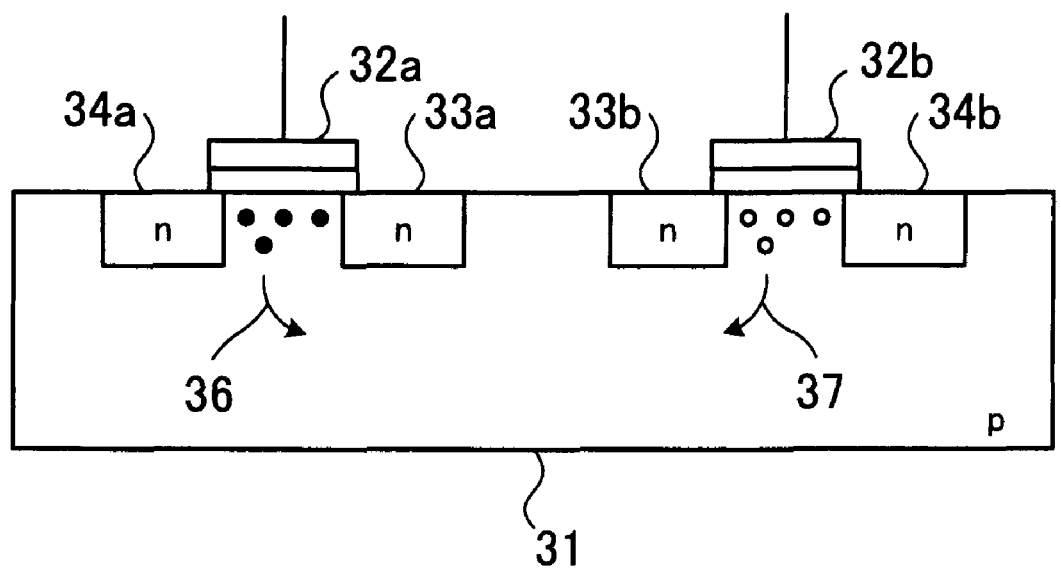
FIG. 5 is a cross-sectional view taken along the dashed line A-A of FIG. 4.

FIG. 5 is a cross-sectional view taken along a dashed line A-A of FIG. 4. In FIG. 5, the same elements as those shown in FIG. 4 are indicated by the same reference numerals as in FIG. 4 and the detailed description is omitted. In FIG. 5, a black circle indicates an electron, and a white circle indicates a hole. Further, "n" indicates that the drain diffusion layers 33a and 33b and the source diffusion layers 34a and 34b are of n-type, and "p" indicates that the well 31 is of p-type.

Now, assume that the transmission line 14a is at the H level and the transmission line 14b is at the L level. Further, assume that due to the capacitances of the drain diffusion layers 33a and 33b, holes and electrons are distributed as shown in FIG.

5. Starting from this state, when the differential signal is switched, that is, when the transmission line 14*a* is switched to the L level and the transmission line 14*b* is switched to the H level, the holes and the electrons transfer as indicated by arrows 36 and 37 of FIG. 5. As a result, the capacitances of the drain diffusion layers 33*a* and 33*b* are artificially reduced with respect to the differential signals so that the delay of the differential signal can be suppressed.

Next, there will be described another structural example of each pair of transistors M1, M2, the transistors M3, M4, the transistors M12, M13 and the transistors M14, M15. In the following, the pair of transistors M1, M2 will be described. A structure of each pair of transistors M3, M4, transistors M12, M13, and transistors M14, M15 is the same as that of the pair of transistors M1, M2 and therefore, the detailed description is omitted.

Figure 6:
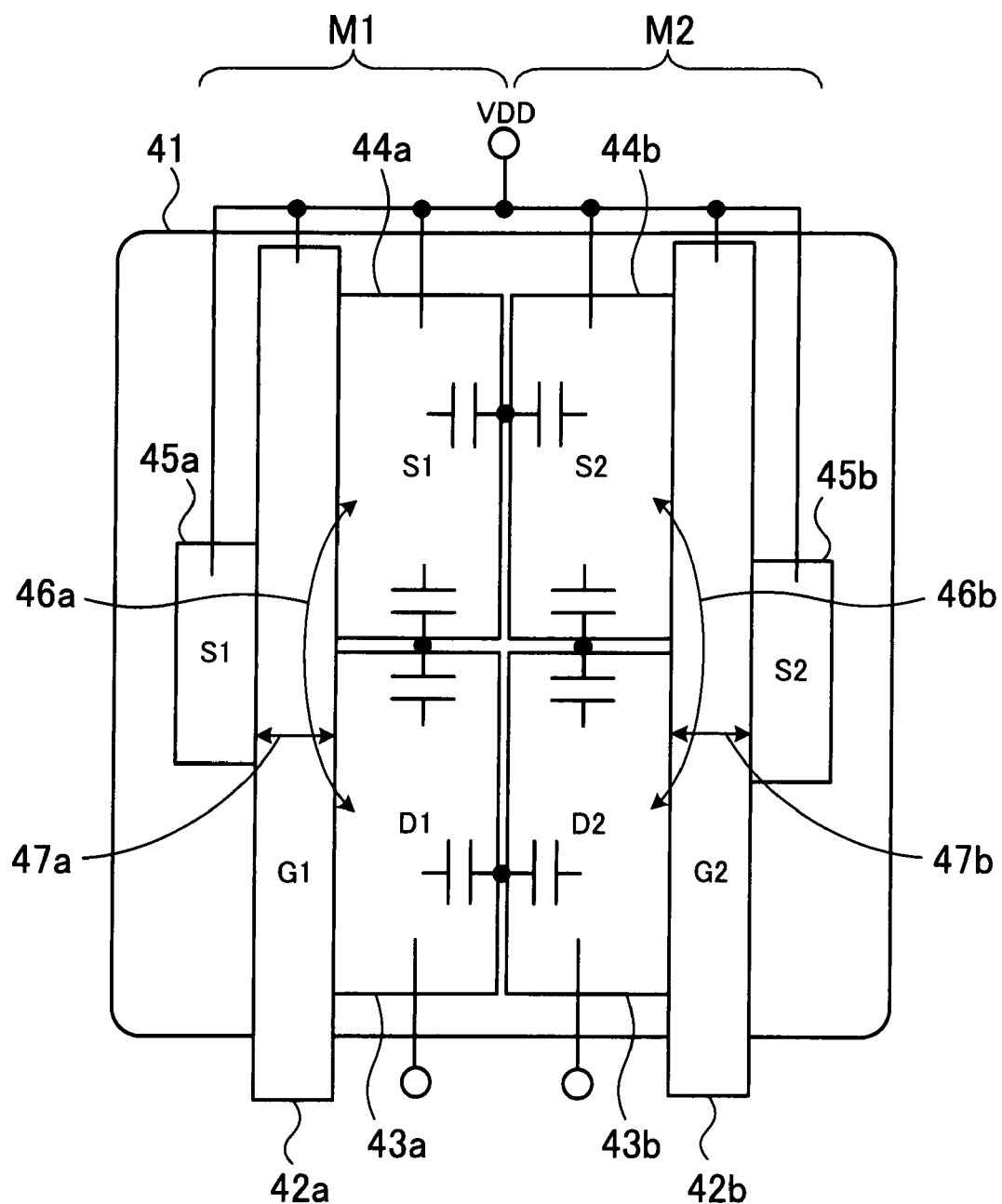
FIG. 6 is a plan view of another example of a pair of transistors formed in the same well.

FIG. 6 is a plan view of another example of a pair of transistors formed in the same well. As shown in FIG. 6, a drain diffusion layer 43*a* and source diffusion layers 44*a* and 45*a* of the transistor M1 are formed in a well 41. A gate electrode 42*a* of the transistor M1 is formed over the well 41. Similarly, a drain diffusion layer 43*b* and source diffusion layers 44*b* and 45*b* of the transistor M2 are formed in the well 41. A gate electrode 42*b* of the transistor M2 is formed over the well 41. G1, G2, D1, D2, S1 and S2 shown in FIG. 6 are abbreviations of the respective sections and a capacitor represents a capacitance generated between the respective sections.

The gate electrodes 42*a* and 42*b* of the transistors M1 and M2 are formed linearly in parallel. The drain diffusion layers 43*a* and 43*b* and the source diffusion layers 44*a* and 44*b* of the transistors M1 and M2 are formed on the side where the gate electrodes 42*a* and 42*b* face to each other. The source diffusion layer 45*a* of the transistor M1 is formed on the side opposite the drain diffusion layer 43*a* and the source diffusion layer 44*a* across the gate electrode 42*a*. The source diffusion layer 45*b* of the transistor M2 is formed on the side opposite the drain diffusion layer 43*b* and the source diffusion layer 44*b* across the gate electrode 42*b*. The gate electrodes 42*a* and 42*b* and the source diffusion layers 44*a*, 44*b*, 45*a*, and 45*b* are connected to each other and connected to the power supply VDD, as shown in FIG. 6. Accordingly, the source diffusion layers 44*a*, 45*a*, 44*b* and 45*b* have the same potential. The drain diffusion layer 43*a* is connected to the transmission line 14*a* and the drain diffusion layer 43*b* is connected to the transmission line 14*b*.

In the case of forming the transistors M1 and M2 as shown in FIG. 6, when the differential signal switches, the charge transfer is performed between the capacitors shown in FIG. 6. Accordingly, the amount of transferred charges increases so that a more rapid response can be achieved with respect to the switching of the differential signal. Meanwhile, by employing the configuration in FIG. 6, a channel length increases as indicated by double arrows 46*a* and 46*b* so that the surge voltage is prevented from being quickly discharged. However, by providing the source diffusion layers 45*a* and 45*b*, the channel length can be reduced as indicated by double arrows 47*a* and 47*b* so that the surge voltage can be quickly discharged. Further, the surge voltage with the same phase can also be discharged effectively by the configuration as shown in FIG. 6.

Next, operations of the transistors M1 and M2 in FIG. 6 will be described.

FIG. 7 illustrates the operations of the transistors in FIG. 6. An input voltage column shown in Table 51 of FIG. 7 shows voltages input to the drain diffusion layers 43*a* and 43*b* in FIG. 6. In FIG. 7, "Over VDD" indicates a case where a voltage (surge voltage) in excess of that of the power supply VDD is input to the drain diffusion layers 43*a* and 43*b*. "H/L" indicates a case where the differential signal having the H level is input to the drain diffusion layer 43*a* and the differential signal having the L level is input to the drain diffusion layer 43*b*. "L/H" indicates a case where the differential signal having the L level is input to the drain diffusion layer 43*a* and the differential signal having the H level is input to the drain diffusion layer 43*b*. The columns of the M1 and M2 in Table 51 show on/off states of the transistors M1 and M2 in FIG. 6. The columns of the S1, S2, D1 and D2 in Table 51 show voltage states of the S1, S2, D1 and D2 shown in FIG. 6.

When a voltage of "Over VDD" is input to the drain diffusion layers 43*a* and 43*b*, the transistors M1 and M2 are turned on as shown in the table 51. The voltages of the S1 and S2 are equal to that of the power supply VDD ("VDD" in FIG. 6). The voltages of the D1 and D2, since the transistors M1 and M2 are turned on, are prevented from becoming that of "Over VDD" and become lower than that of "Over VDD".

When the differential signal having the H level is input to the drain diffusion layer 43*a* and the differential signal having the L level is input to the drain diffusion layer 43*b*, the transistors M1 and M2 are turned off as shown in Table 51. The voltages of the S1 and S2 are equal to that of the power supply VDD. The voltage of the D1 is equal to that of the power supply VDD and the voltage of the D2 is equal to the ground voltage GND.

When the differential signal having the L level is input to the drain diffusion layer 43*a* and the differential signal having the H level is input to the drain diffusion layer 43*b*, the transistors M1 and M2 are turned off as shown in Table 51. The voltages of the S1 and S2 are equal to that of the power supply VDD. The voltage of the D1 is equal to the ground voltage GND and the voltage of the D2 is equal to that of the power supply VDD.

In the switching of the differential signal, the charge transfer in the same well is performed as indicated by the arrows 52 and 53 in FIG. 7. Further, the surge absorption is performed as indicated by the arrows 54 and 55 in FIG. 7.

Next, the surge absorption (energy dispersion) will be described. The surge absorption is performed by a channel capacitance of the turned-on transistor. The transmission line also plays an important role in the surge absorption. Therefore, transmission of electromagnetic energy via the transmission line will be first described.

In the line in the LSI, an RC delay occurs due to series resistances in the circuit and all the capacitances in the circuit. When a voltage step wave is transmitted to the line, the wave has an integrated waveform due to the RC delay. A rising voltage step is $v=VDD(1-\exp(-t/RC))$ and a falling voltage step is $v=VDD(\exp(-t/RC))$. Therefore, the time for reaching the threshold voltage Vth where the signal state transits is delayed. As a result, the signal state transits to the next state before the state transition is completed.

In a circuit model where the operating frequency is 10 GHz or more, when the transition time is 25 ps ($t_r=t_f=0.3/f$, $t_r$: rising time, $t_f$: falling time), an allowance of jitter is 1 to 3 ps and therefore, the RC time constant must be set below several picoseconds. When the total of wiring resistances and on-resistances of the transistors is set to 100Ω, the whole capacitance in the circuit must be limited below several tens of femtofarads and therefore, it is practically difficult to produce a circuit. That is, a transmission line with no RC delay is required. In general, such a transmission line cannot be realized using the RLCG circuit model. Meanwhile, the transmission line typified by a coaxial cable is in a TEM (Transverse Electromagnetic Mode) electromagnetic wave transmission mode. Through the transmission line, electrical energy is transmitted as electromagnetic energy. Therefore, a concept of the transmission line is freed from that of the LC ladder. In the following, the transmission line will be described by daringly using the RLCG circuit model.

FIGS. 8A, 8B, 8C, 8D and 8E each show a simple model of the transmission line. In FIGS. 8A to 8E, a battery E, transmission lines 61a and 61b as a pair line and a lamp 62 are indicated. To transmit electrical energy, the two transmission lines 61a and 61b are indispensable. Assume that impedance of the lamp 62 is larger than those of the transmission lines 61a and 61b.

The battery E plays a role of a pump as shown in FIG. 8A. Now assume that the battery E is connected between the transmission lines 61a and 61b. Starting from this state, the battery E receives electrons from the transmission line 61a and outputs the electrons to the transmission line 61b. As a result, holes are generated in the transmission line 61a as shown in FIG. 8B. Further, the holes and the electrons are transmitted at the velocity of light as shown in FIG. 8C.

When reaching the lamp 62, the holes and the electrons combine to release energy as light as shown in FIG. 8D. Meanwhile, since the impedance of the lamp 62 is larger than those of the transmission lines 61a and 61b, excess electrons and holes exist and flow back (reflect) to the battery E as shown in FIG. 8E. Thus, reflection may occur in the transmission lines 61a and 61b.

Figure 8:
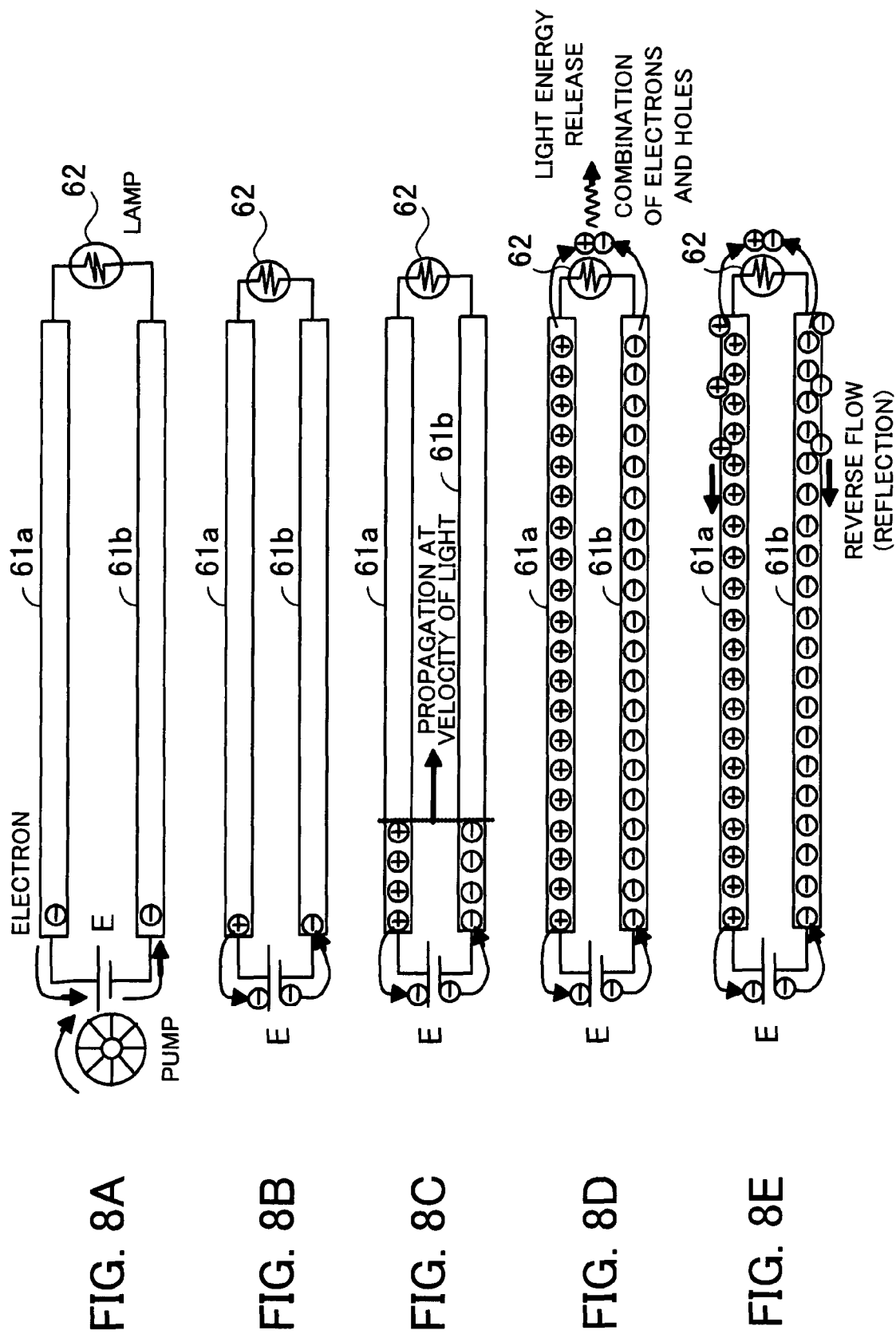
FIGS. 8A, 8B, 8C, 8D and 8E each are a simple model of a transmission line.
Figure 9:
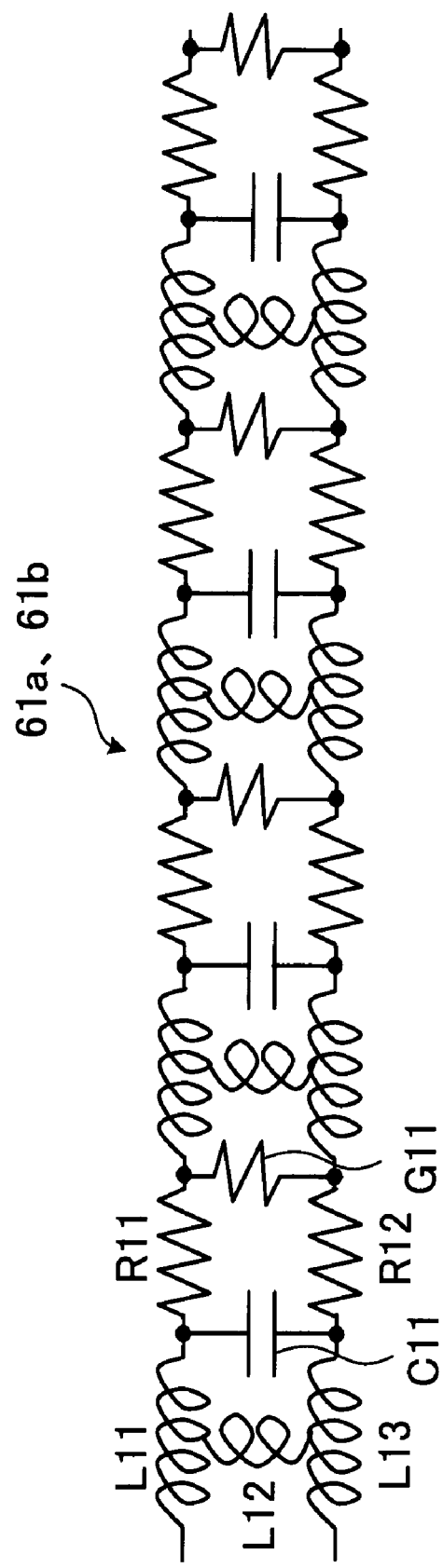
FIG. 9 is a model view of the transmission line in FIG. 8 represented by RLCG elements.

FIG. 9 is a model view of the transmission line in FIG. 8 represented by RLCG elements. As shown in FIG. 9, the transmission lines 61a and 61b of the pair line shown in FIG. 8 can be represented by a ladder circuit composed of inductances L11 to L13, resistances R11 and R12, a capacitance C11 and a conductance G11. A cross-sectional structure of the transmission lines 61a and 61b is constant in the longitudinal direction. Therefore, the RLCG elements of the ladder circuit in FIG. 9 exist simultaneously per unit length and are physically different from the representation in FIG. 9. Even if the transmission lines are subdivided, a rate of the RLCG elements is constant. When expressing this fact by the characteristic impedance, $Z_0 = \{(R/1)+(j\omega L/1)\}^{1/2}/\{(G/1)+(j\omega C/1)\}^{1/2}$ is obtained. In the equation, 1 represents a unit length, $\omega$ represents an angular frequency and j represents an imaginary unit.

The conductance G and the capacitance C exist in a denominator. Considering two complex numbers as impedance, the geometric mean of their complex numbers is taken. A reason why an arithmetic mean value is not taken as in a circuit using the Kirchhoff's law is that all the elements exist simultaneously per unit length. In the above equation, "1" can be canceled out and therefore, the characteristic impedance is represented by the equation having no unit length. When considering a pipe through which water flows, the pipe has a unit in which only a frontage (cross-section area, conductance) of the pipe is specified and a length direction thereof is not specified.

Next, description will be made on the case of setting the resistances R11 and R12 and the conductance G11 to zero in FIG. 9.

FIGS. 10A and 10B are model views in the case of setting the resistance and conductance to zero in FIG. 9. In FIGS. 11A and B, current waveforms 71 and 73 flowing through the LC ladder circuit and voltage waveforms 72 and 74 are indicated. In the characteristic impedance $Z_0$ described above, since the resistance R and the conductance G are set to zero, $Z_0 = (L/C)^{1/2}$ is obtained. Inductance L existing in the portion where gradient of the current is maximal mainly functions as the impedance ($\omega L$). Capacitance C existing in the portion where a voltage is at the maximum value mainly functions as the impedance ($1/(\omega C)$). Therefore, only the inductance L and capacitance C in such portions are typically described in FIGS. 10A and 10B.

Even if the waveforms 71 to 74 shown in FIG. 10 travel to the right side of FIG. 10 at the velocity of light, each sectional portion of the transmission lines has the same elements and therefore, the inductance L and the capacitance C follow the waveforms to be induced on the sectional portion. In other words, electrical energy stored in the inductance L and the capacitance C travels through the transmission line. Specifically, $P=IV=V^2/Z_0$ travels therethrough. Since the inductance L and the capacitance C are represented by the characteristic impedance $Z_0$, the transmission lines are set to a transmission mode where the inductance L and the capacitance C do not exist separately.

FIG. 10B shows a model having a frequency twice that of FIG. 10A. When the frequency is doubled, a section of the inductance L and the capacitance C in FIG. 10B is induced at an interval half that of FIG. 10A. Accordingly, waveforms 73 and 74 travel at the velocity of light under the characteristic impedance equal to that of FIG. 10A. This is a reason why the transmission line having the resistances R11 and R12 and conductance G11 of zero has no frequency characteristic.

When the resistance R and the conductance G are not negligible, $\omega$ in a complex number fails to disappear and therefore, the transmission line has a frequency characteristic. However, since the inductance L and the capacitance C simultaneously exist, the transmission line is also set to a transmission mode where the inductance L and the capacitance C are seemingly invisible. In GHZ band, such a transmission line is required even being a chip interconnection.

The reason is that in the case of a digital clock signal of 6 GHz, a tenfold harmonic component also exists as considerable energy and therefore, the transmission line must allow a 60 GHz signal to pass therethrough. A wavelength of the signal is 3.2 mm and therefore, a quarter wavelength capable of preventing resonance is 0.8 mm. Accordingly, a global wiring between IPs (Intellectual Property) and an I/O wiring leading to pads must be formed into the transmission line.

A surge voltage, as long as passing through the transmission line, has an Ohm's law relationship with the characteristic impedance $Z_0$. Since Vsrg=Isrg·$Z_0$ (Vsrg: surge voltage, Isrg: surge current) holds, $Z_0$ is preferable smaller. However, since reflection occurs in the discontinuous parts of a line or load impedance, this reflection must be considered. For example, since the gate of the transistor is regarded almost as an open end, positive total reflection occurs in the gate and therefore, the surge voltage becomes 2 Vsrg. Since impedance mismatch occurs in all the branched interconnections, the connection of the ESD protection circuit must be contrived.

Next, dispersion of surge energy will be described.

Figure 11:
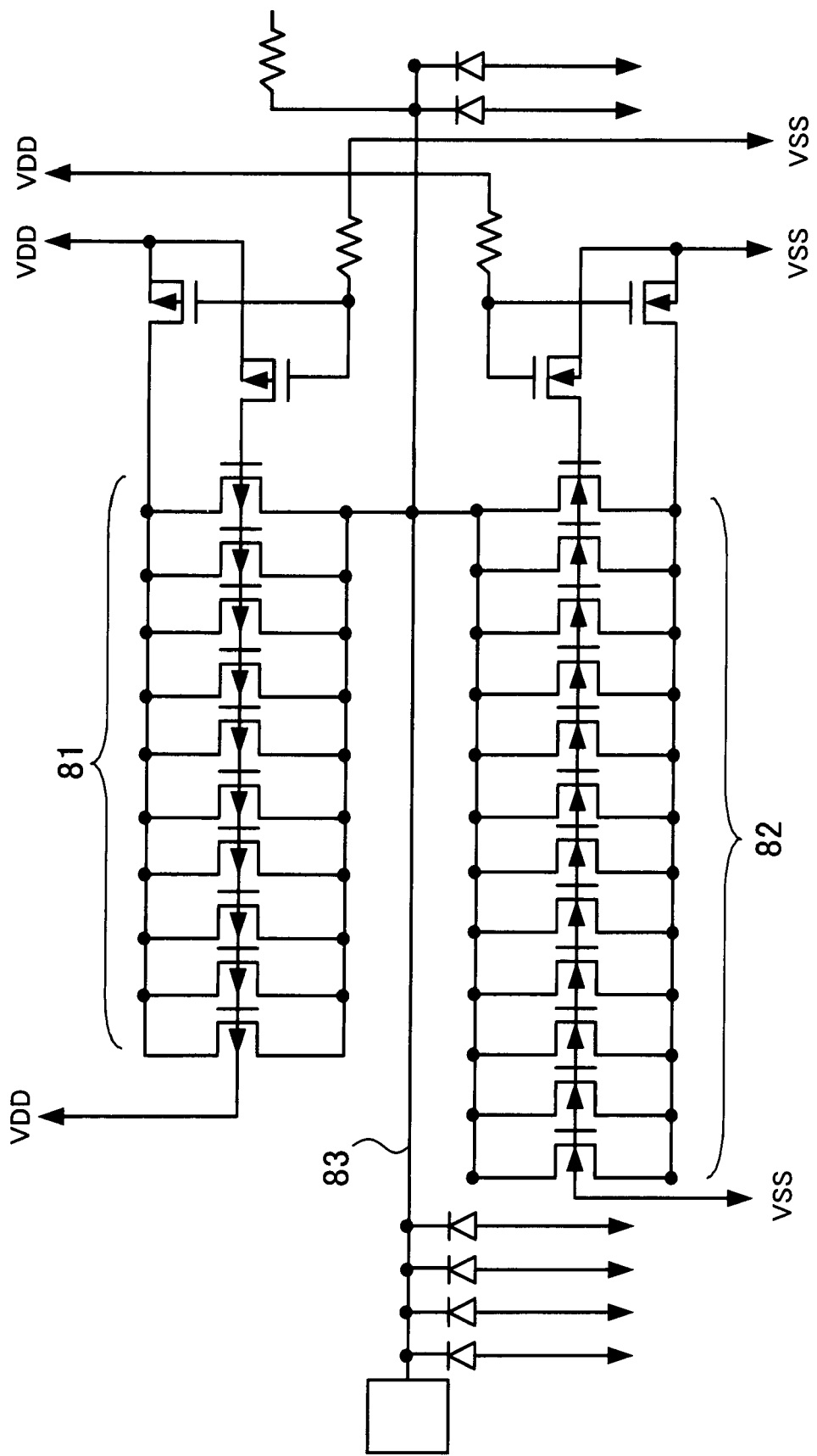
FIG. 11 is a circuit diagram of a dummy circuit provided for the ESD countermeasure.

FIG. 11 is a circuit diagram of a dummy circuit provided for ESD measures. The dummy circuit in FIG. 11 is a conventionally used circuit. As shown in FIG. 11, the dummy circuit has dummy MOS circuits 81 and 82. The dummy circuit in FIG. 11 is provided for a signal line 83. Further, the dummy circuit is provided similarly for a power supply line and a ground line.

The dummy MOS circuits 81 and 82 are circuits for increasing a diffusion capacitance and play a role in instantaneously averaging high-voltage energy as well as reducing the voltage below that of the power supply VDD. However, the diffusion capacitance constitutes a large limiting factor in the speeding up of signals. Meanwhile, in the circuit in FIG. 1, although the transistors M1 to M4 and the transistors M12 to M15 for performing a clamping function have a large capacitance, the capacitance is artificially reduced with respect to the switching of the differential signals so as to achieve the speeding up of a signal. Further, the surge energy is gradually dispersed to be effectively absorbed.

Incidentally, the human body has an equivalent capacitance of 140 pF when standing on both feet, 94 pF when standing on one foot, and 54 pF when sitting on the round chair. Now, assuming that the human body is charged by 10000V in a maximum capacitance state, the electric charges are equal to $Q=CV=1.4$ μC. In order to reduce this voltage below 0.5 V only by a capacitance during the saturation, a capacitance of $1.4 \times 10^{-6}/0.5V = 2.8 \times 10^{-6}$ F is required. This value is extremely large. Even in the circuit of FIG. 11, the capacitance is about several pF. In spite of this fact, practically, the circuit somehow settles for this capacitance (a voltage of about 500V during the saturation). One of the reasons is that electrostatic energy is naturally dispersed gradually. Accordingly, the circuit in FIG. 1 is designed to actively disperse surge energy gradually. In a state where the maximum charge amount of the human body is output, since an internal impedance of the human body is about 500Ω, a current I is represented by the equation $i=(V/R)\exp\{-(t/RC)\}$. R in this equation is changed by the impedance on the chip side.

Figure 12:
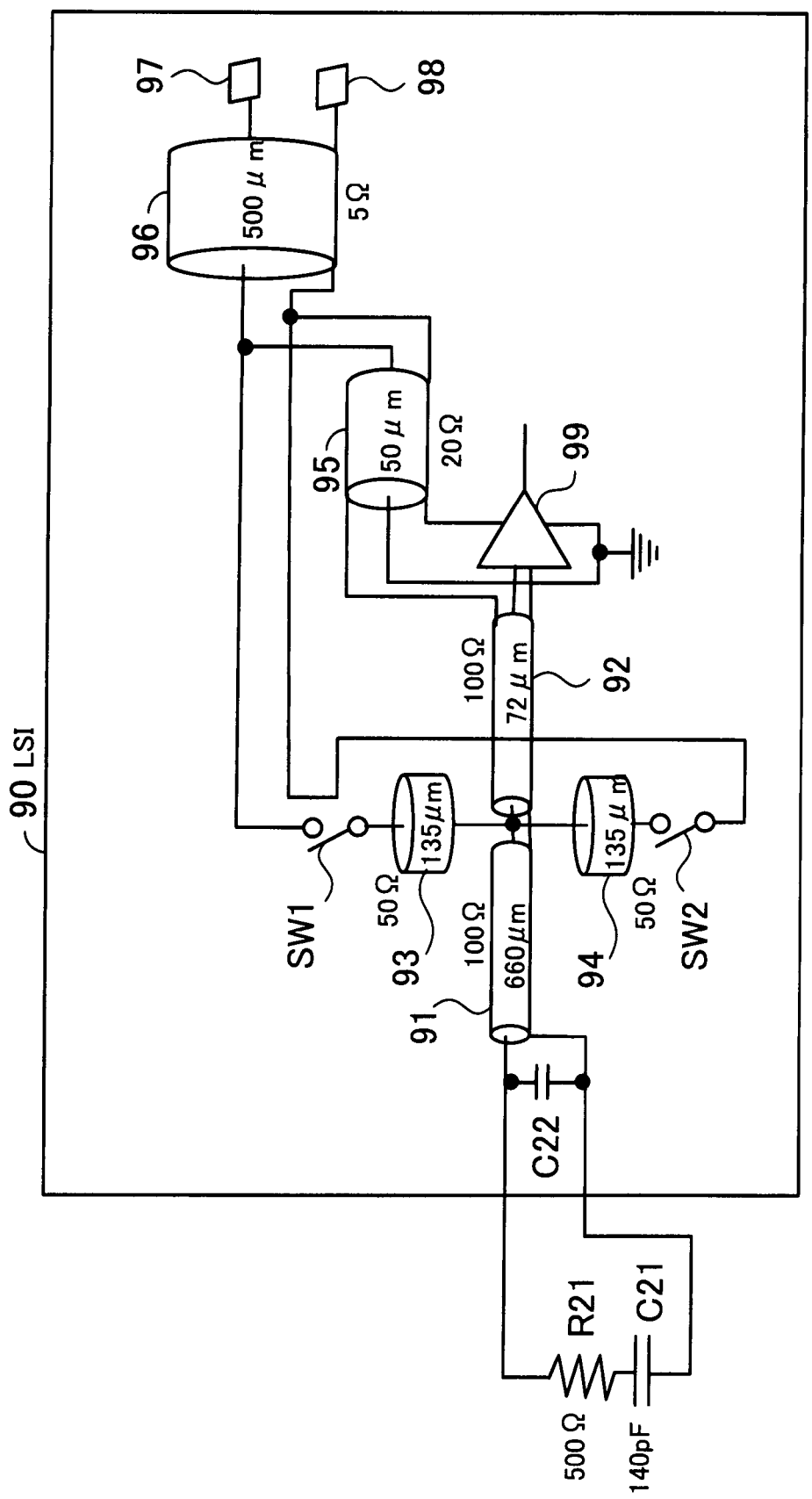
FIG. 12 is a circuit diagram showing an ESD countermeasure model in FIG. 1.

FIG. 12 is a circuit diagram showing an ESD measure model in FIG. 1. As shown in FIG. 12, an LSI 90 has transmission lines 91 to 96, a power supply pad 97, a ground pad 98, a driver 99 and switches SW1 and SW2. The transmission lines 91 to 96 shown in FIG. 12 play an important role in providing measures against the surge voltage. In FIG. 12, the switch SW1 corresponds to the pair of transistors M1, M2 shown in FIG. 1 and the switch SW2 corresponds to the pair of transistors M3, M4. The driver 99 corresponds to the driver circuit 12 in FIG. 1. The transmission lines 91 and 92 correspond to the transmission lines 14a and 14b in FIG. 1. The transmission lines 93 and 94 correspond to the transmission lines branched into the transistors M1 to M4 from the transmission lines 14a and 14b in FIG. 1. The transmission line 95 corresponds to the transmission lines branched into the driver circuit 12 from the power supply VDD. The transmission line 96 corresponds to the power supply VDD/ground pair transmission line. The capacitor C22 represents a capacitance of a chip pad. In FIG. 12, line lengths and characteristic impedances of the respective transmission lines are indicated. Further, a resistor R21 and capacitor C21 indicated in the outside of the LSI 90 represent a resistance and capacitance of the human body, respectively. In FIG. 12, examples of a resistance value and capacitance value of the human body are indicated.

Assume that the electric charge amount of 1.4 μC flows into the LSI from the human body charged by Vs=10000V. Assume, however, that a capacitance of the chip pad in the LSI (a capacitance of the capacitor C22) is negligibly small. In this case, a voltage represented by the following equation (1) is input to the transmission line 91.

$$v = v_s \exp\{-t/(R_h + Z_{01})C_h\} \quad (1)$$
$$= 10000 \exp\{-t/(500+100)140 \times 10^{-12}\}$$
$$= 10000 \exp(-t/84 \times 10^{-9})$$

Note, however, that $R_h$ and $C_h$ represent a resistance and capacitance of the human body and $Z_{01}$ represents the characteristic impedance of the transmission line 91. Therefore, a current i is represented by the equation $i=v/(R_h+Z_{01})=v/600$.

Next, consider a portion in which the transmission line 91 is branched into the switches SW1 and SW2. The surge voltage input to the transmission line 91 is divided into three branched paths to the switches SW1 and SW2 and the transmission line 92. The characteristic impedance $Z_{0T}$ after the branched paths viewed from an input side of the LSI is reduced to $1/(1/100Ω+1/50Ω+1/50Ω)=20Ω$. Accordingly, most of the energy is negatively reflected in this portion and a passing current is represented by the following equation (2).

$$it = i(1-\Gamma) \quad (2)$$
$$= i\left(1 - \frac{Z_{0T}-Z_{01}}{Z_{0T}+Z_{01}}\right)$$
$$= i\left(1 - \frac{20-100}{20+100}\right)$$
$$= 0.333i$$

From the Kirchhoff's law, a current input to the rear transmission line 92 from the branched path is $i_r = 1/5 \, i_t = 0.0667 \, i$. Therefore, a voltage $Vr = 0.0667 \, i \cdot Z_{02} = 6.67 \, i$ is obtained. Here, $Z_{02}$ represents the characteristic impedance of the transmission line 92. When an input terminal of the driver 99 has a gate capacitance of the transistor, the voltage rise $V_G$ is represented by the following equation (3) by setting the gate capacitance to $C_G = 20$ fF.

$$v_G = v_r\{1 - \exp(-t/Z_{02}C_G)\} \quad (3)$$
$$= 6.67i\{1 - \exp(-t/Z_{02}C_G)\}$$
$$= 0.0111v_s\{1 - \exp(-t/Z_{02}C_G)\}$$
$$= 111\exp(-t/84 \times 10^{-9})\{1 - \exp(-t/Z_{02}C_G)\}$$

Figure 13:
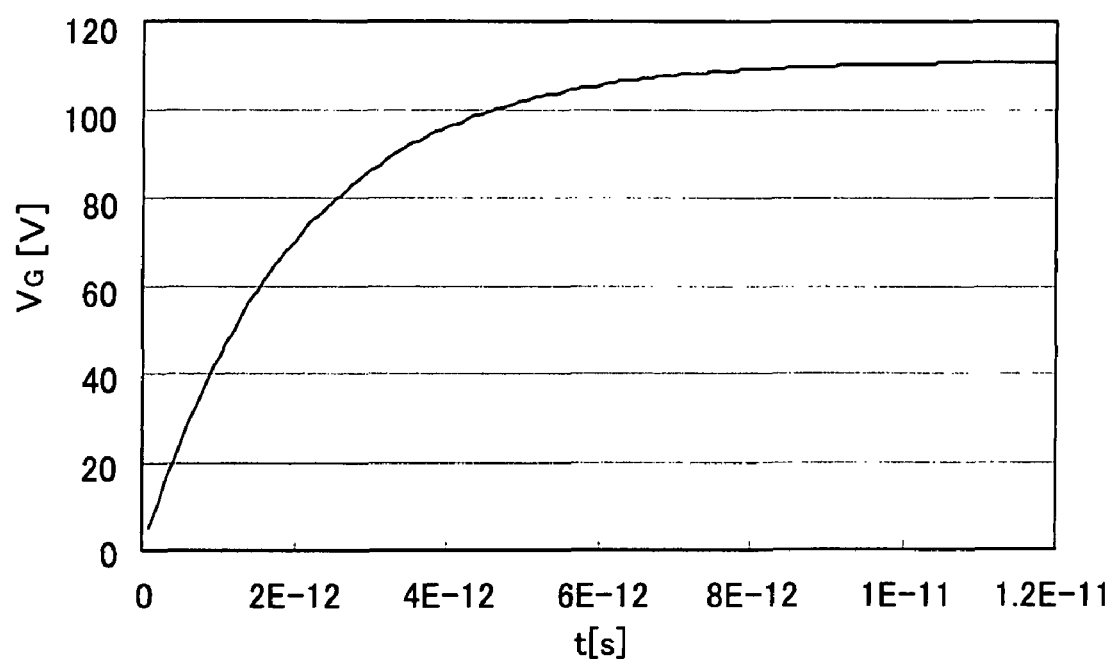
FIG. 13 shows a time change of $V_G$.

FIG. 13 shows a time change of $V_G$. Specifically, FIG. 13 shows the time change $V_G$ in the case of setting $Z_{02}=100Ω$ and $C_G=20$ fF in equation (3). As shown in FIG. 13, even if a voltage of 10000V is input, the voltage rise is only 111V at a maximum. That is, the voltage rise is suppressed to a value sufficiently smaller than a static limit prediction 500V.

In all the portions of the transmission lines having different characteristic impedances, the above-described reflection occurs and energy of the respective transmission lines is multiply reflected. However, during the time for electrostatic energy to be reflected and return to the transmission lines, the energy is gradually dispersed so that a surge voltage can be effectively absorbed.

As described above, the characteristic impedance determines a size of a frontage in which charges flow. As the characteristic impedance is smaller, a size of the frontage is more increased to facilitate the absorption of the surge voltage. Accordingly, when the characteristic impedances of the transmission lines 93 and 94 as the branched lines as well as the on-resistances of the switches SW1 and SW2 (on-resistances of the clamp transistors) are equal to or smaller than the characteristic impedances of the transmission lines 91 and 92, the surge voltage can be effectively absorbed. Further, when the switches SW1 and SW2 are connected to the power supply/ground pair transmission line 96 having the characteristic impedance equal to or smaller than the on-resistances of the switches SW1 and SW2, the surge voltage can be effectively absorbed.

Next, a simulation of the surge voltage will be described.

Figure 14:
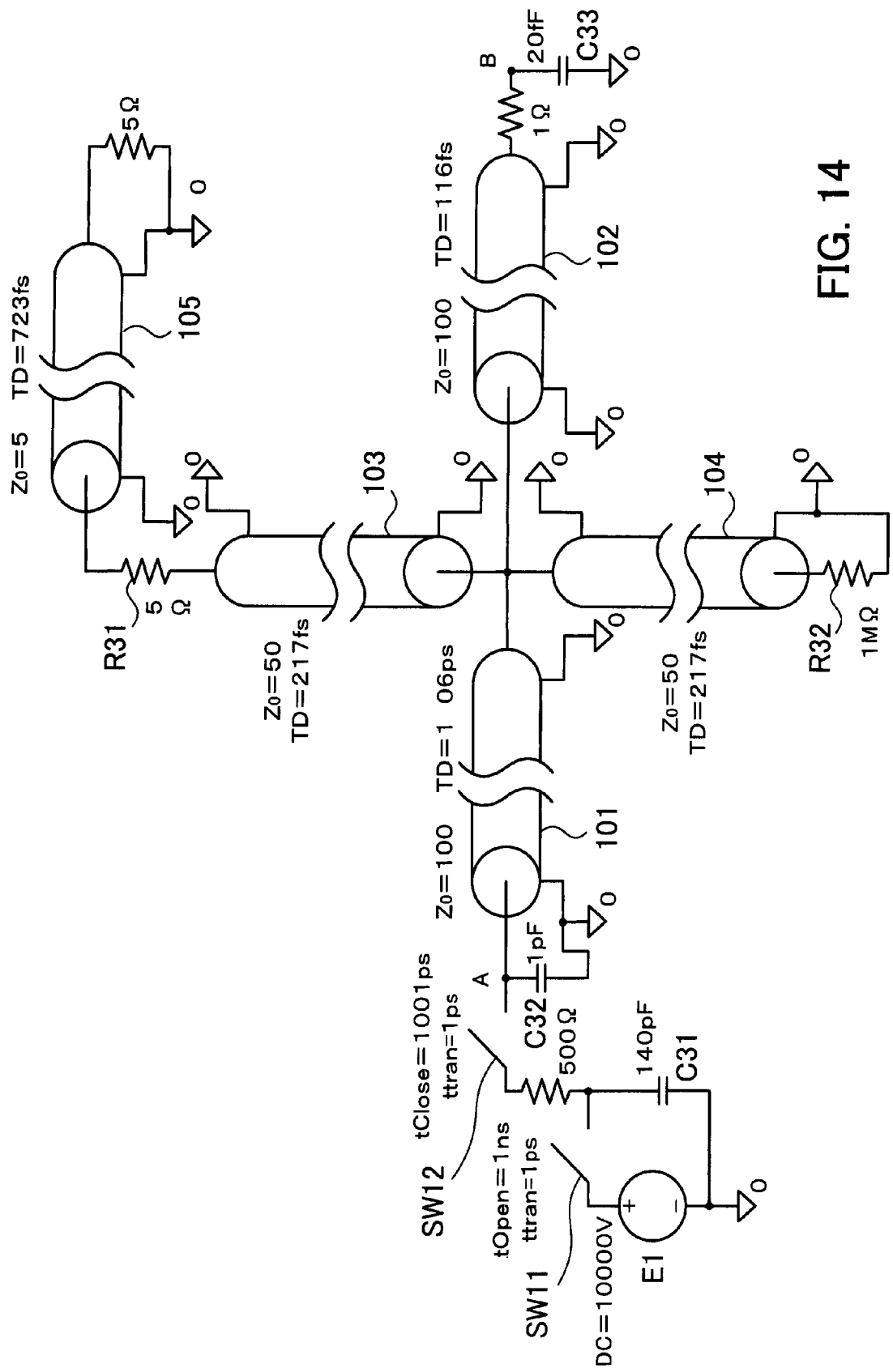
FIG. 14 is a circuit diagram of an LSI for performing a simulation of a surge.

FIG. 14 is a circuit diagram of the LSI for performing a simulation of the surge voltage. FIG. 14 shows a circuit simulation of single ended voltages. In FIG. 14, transmission lines 101 and 102 correspond to the transmission lines 14a and 14b in FIG. 1. Transmission lines 103 and 104 correspond to the transmission lines branched into the transistors M1 to M4 in FIG. 1. A resistance R31 corresponds to the resistances of the on-state pair of transistors M1, M2 and a resistance R32 corresponds to the resistances of the off-state pair of transistors M3, M4 in FIG. 1. A transmission line 105 corresponds to a power supply VDD/ground pair transmission line. A capacitor C33 corresponds to the gate capacitances of the transistors M8 to M11 in the driver circuit 12. Further, a power supply E1 and capacitor C31 represent a voltage and capacitance of the human body, and a capacitor C32 represents a capacitance of a chip pad of the LSI. In FIG. 14, the characteristic impedance values and delay times of the transmission lines 101 to 105 are indicated. Further, on/off conditions of switches SW11 and SW12 for regulating an input state of surge voltage are indicated. Specifically, the switch SW11 is opened from 0 s to 1 ns (tOpen). Then, the switch 11 is closed to cause the voltage to become saturated (ttran) in 1 ps. Further, the switch SW12 is closed for 1001 ps (tClose). Then, the switch SW12 is opened to cause the voltage to become 0V in 1 ps (ttran). Assuming that the surge energy is reversely reflected due to the characteristic impedance of the power supply VDD/ground pair transmission line 105 and totally absorbed into the power supply VDD, the transmission line 105 is matched with a terminating resistance of 5Ω.

Figure 15A:
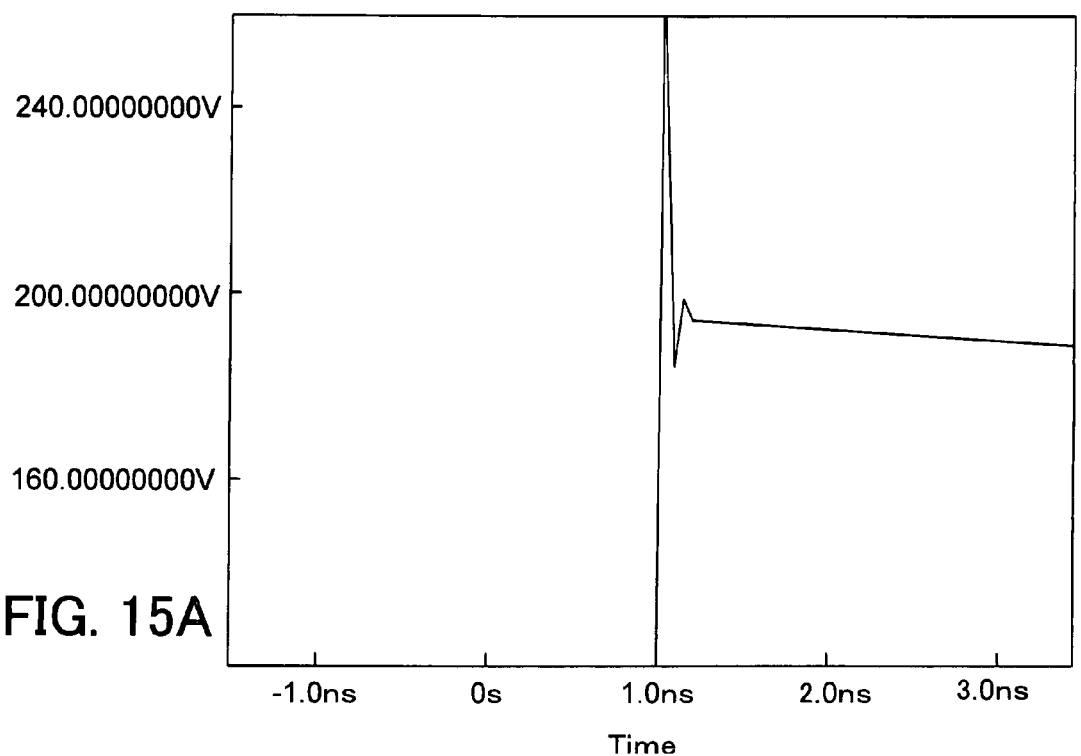
FIGS. 15A and 15B each show simulation results of the circuit diagram in FIG. 14.
Figure 15B:
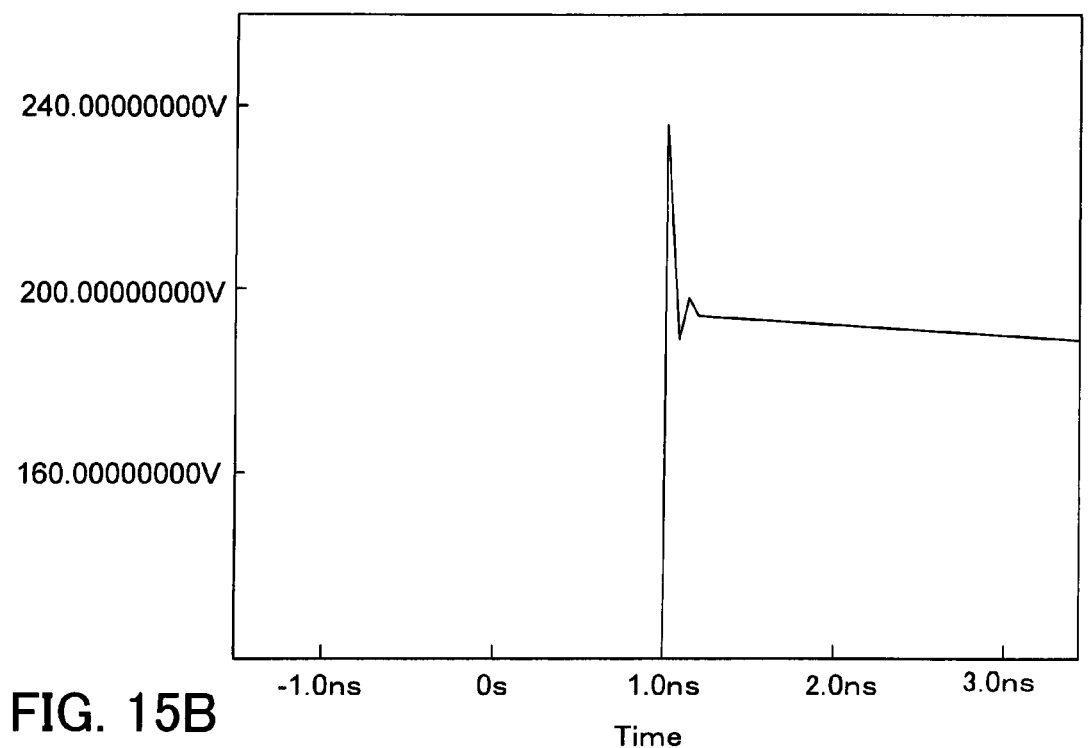

FIGS. 15A and 15B show simulation results of the circuit diagram in FIG. 14. FIG. 15A shows a voltage waveform at a point A in FIG. 14 and FIG. 15B shows a voltage waveform at a point B in FIG. 14. As shown in FIG. 15A, the surge voltage of 10000V is suppressed to about 300V at the point A. As shown in FIG. 15B, the surge voltage of 10000V is suppressed to about 240V at the point B. A voltage waveform of FIG. 15B shows a case where the surge energy is totally reflected at the point B, and a voltage in the capacitor C33 is reduced to half of the voltage at the point B. Accordingly, it is found that this voltage almost agrees with that described in the above equation.

When thus using the high-speed transmission line network instead of connecting a large capacitor, a surge voltage can be effectively absorbed.

Next, a device layout of the LSI will be described.

Figure 16:
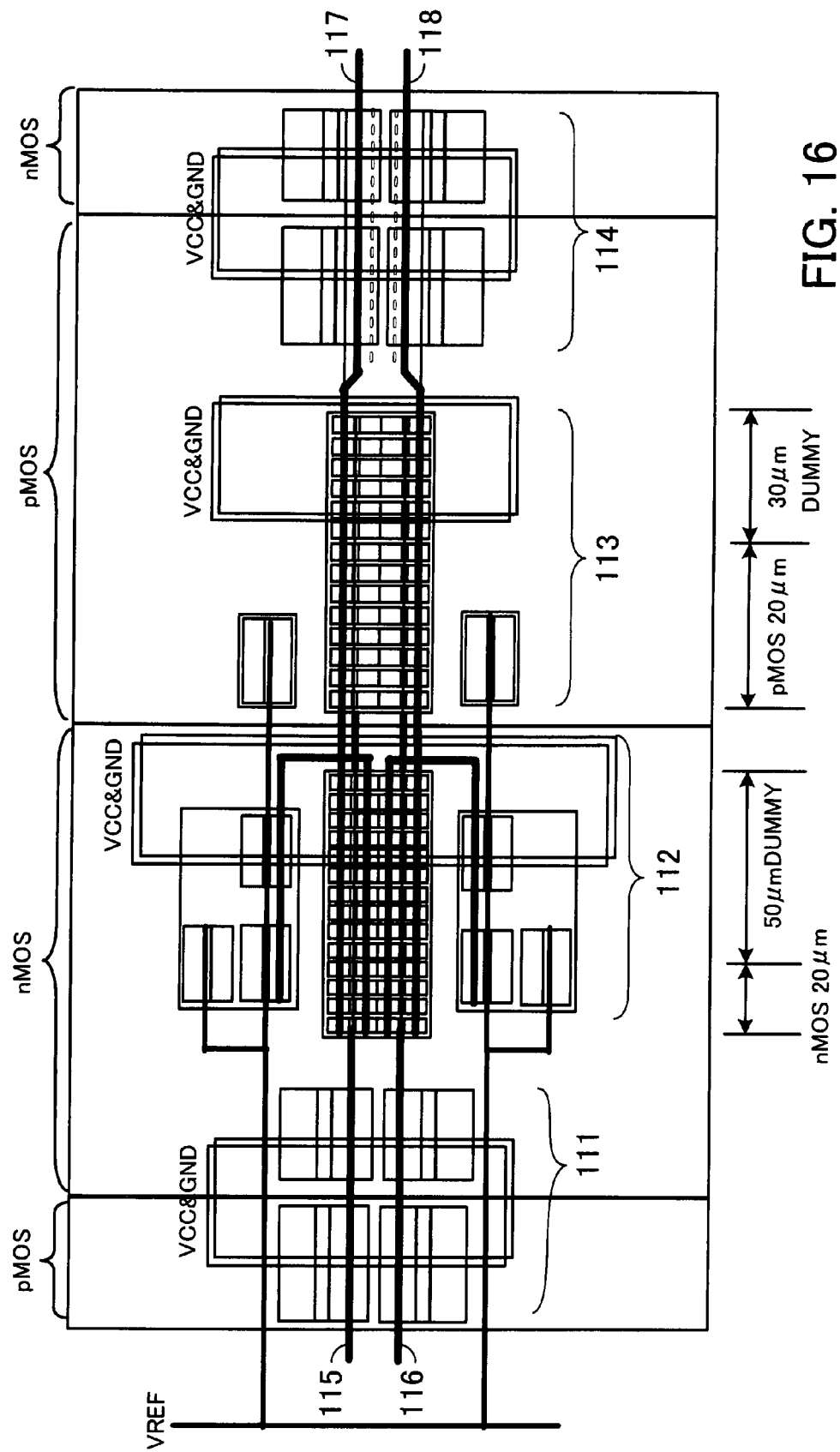
FIG. 16 shows a device layout of an LSI circuit.

FIG. 16 shows the device layout of the LSI circuit. In FIG. 16, transmission lines 115 and 116 correspond to the transmission lines 14a and 14b in FIG. 1. An ESD protection circuit 111 corresponds to the ESD protection circuit 11 in FIG. 1. An NMOS inverter circuit 112 and PMOS inverter circuit 113 correspond to the driver circuit 12 in FIG. 1. An ESD protection circuit 114 corresponds to the ESD protection circuit 13 in FIG. 1. Transmission lines 117 and 118 correspond to the transmission lines 15a and 15b in FIG. 1. VCC&GND represents a power supply VDD/ground pair transmission line. A 50 µm dummy corresponds to the dummy MOS circuits 81 and 82 in FIG. 11 and is designed to adjust an on-resistance of a 20 µm nMOS transistor so as to enhance design freedom. A 30 µm dummy corresponds to the dummy MOS circuits 81 and 82 in FIG. 11 and is designed to adjust an on-resistance of a 20 µm pMOS transistor so as to enhance design freedom.

Next, a simulation of the differential signal will be described. The capacitance (the sum of the gate. capacitance and drain capacitance) of the pair of transistors in the ESD protection circuit is calculated as represented by the following equation (4).

$$C_{ox} = \frac{k_{sio2} \cdot \varepsilon_0}{t_{ox}} L \cdot W \qquad (4)$$

$$= \frac{3.9 \times 8.86 \times 10^{-14}}{4 \times 10^{-7}} \times 0.2 \times 10^{-4} \times 50 \times 10^{-4}$$

$$= 86.25 \times 10^{-15} = 86.25 fF$$

$$C_{JD} = C_{jo} \cdot A_D = 0.75 \times 10^{-15} \times 250 = 187.5 fF (nMOS)$$

$$C_{JD} = C_{jo} \cdot A_D = 0.62 \times 10^{-15} \times 350 = 217 fF (pMOS)$$

$$C_{OX} + C_{JD} = 273.75, \ 303.25 fF (nMOS, pMOS)$$

Note, however, that COX is a capacitance of a gate oxide film, $K_{sio2}$ is a specific dielectric constant of $SiO_2$, $\varepsilon_0$ is an electric constant, $t_{OX}$ is a thickness of a gate oxide film, L is a gate length of a transistor, W is a gate width of a transistor, $C_{JD}$ is a capacitance of a drain diffusion layer, $C_{JO}$ is a capacitance of a drain diffusion layer per unit area, and $A_D$ is an area of a drain diffusion layer. Here, assuming that a transistor capacitance in the case where the pair of transistors of the ESD protection circuit is not formed in the same well is 250 fF and a transistor capacitance in the case where the pair of transistors of the ESD protection circuit is formed in the same well is 50 fF which is one fifth of 250 fF, an output of a 10 GHz input differential signal is simulated.

Figure 17:
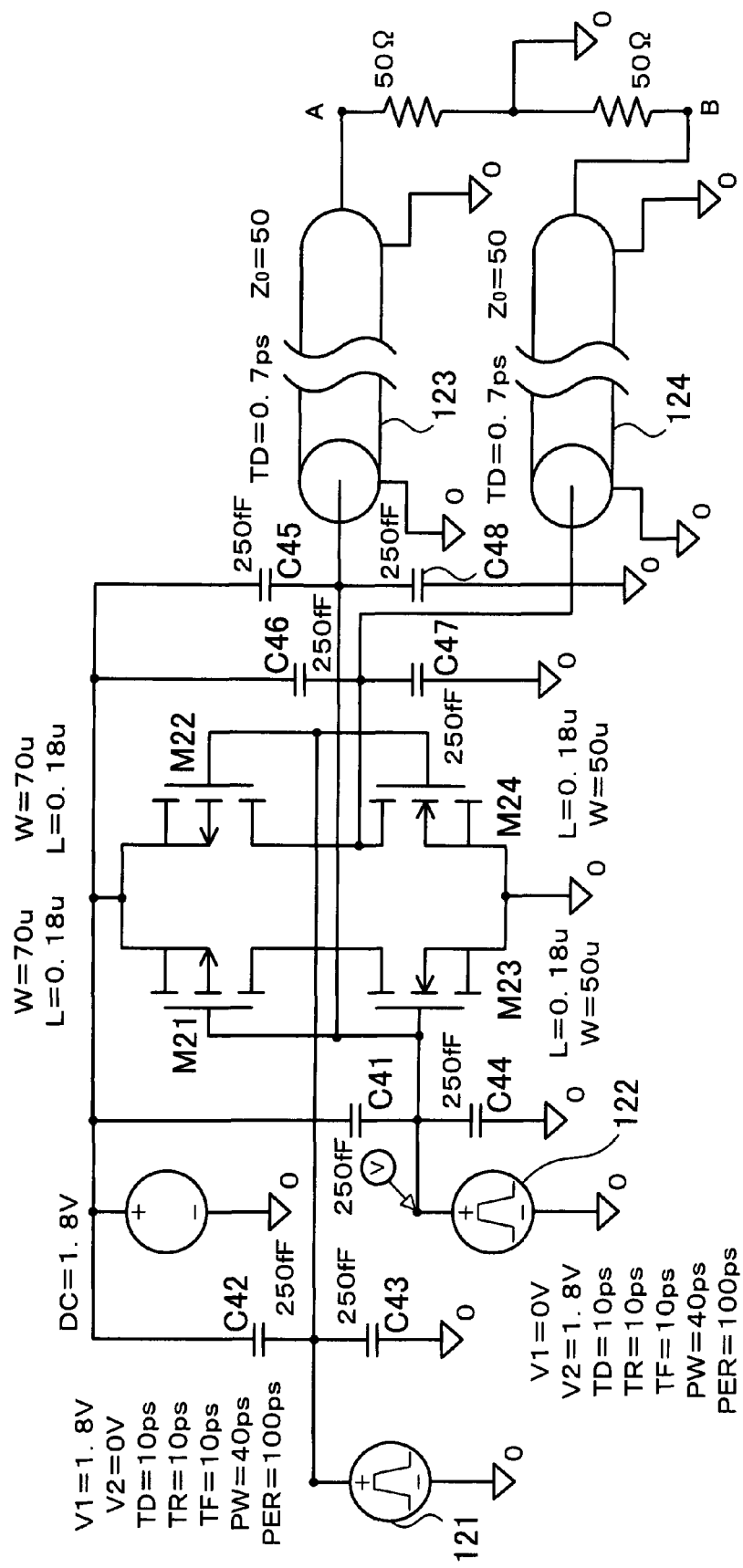
FIG. 17 shows a circuit for performing a simulation of differential signals in the case where a pair of transistors is not formed in the same well.

FIG. 17 shows a circuit for performing a simulation of differential signals in the case where the pair of transistors is not formed in the same well. Capacitors C41 to C44 in FIG. 17 correspond to capacitances in the case where each pair of transistors M1, M2 and transistors M3, M4 in FIG. 1 is not formed in the same well. Capacitors C45 to C48 in FIG. 17 correspond to capacitances in the case where each pair of transistors M12, M13 and transistors M14, M15 in FIG. 1 is not formed in the same well. Transistors M21 to M24 correspond to the transistors M8 to M11 of the driver circuit 12. Transmission lines 123 and 124 correspond to the transmission lines 15a and 15b. Differential signals 121 and 122 represent signals for performing a simulation. Assume that the simulation is performed using parameters in FIG. 17. TD represents a delay time of signals, TR represents a rising time of signals, TF represents a falling time of signals, PW represents a time for a signal state to be held and PER represents a period. Further, W represents a gate width of the transistor, and L represents a gate length of the transistor. Each capacitance of the capacitors C41 to C48 is set to 250 fF as described above.

Figure 18:
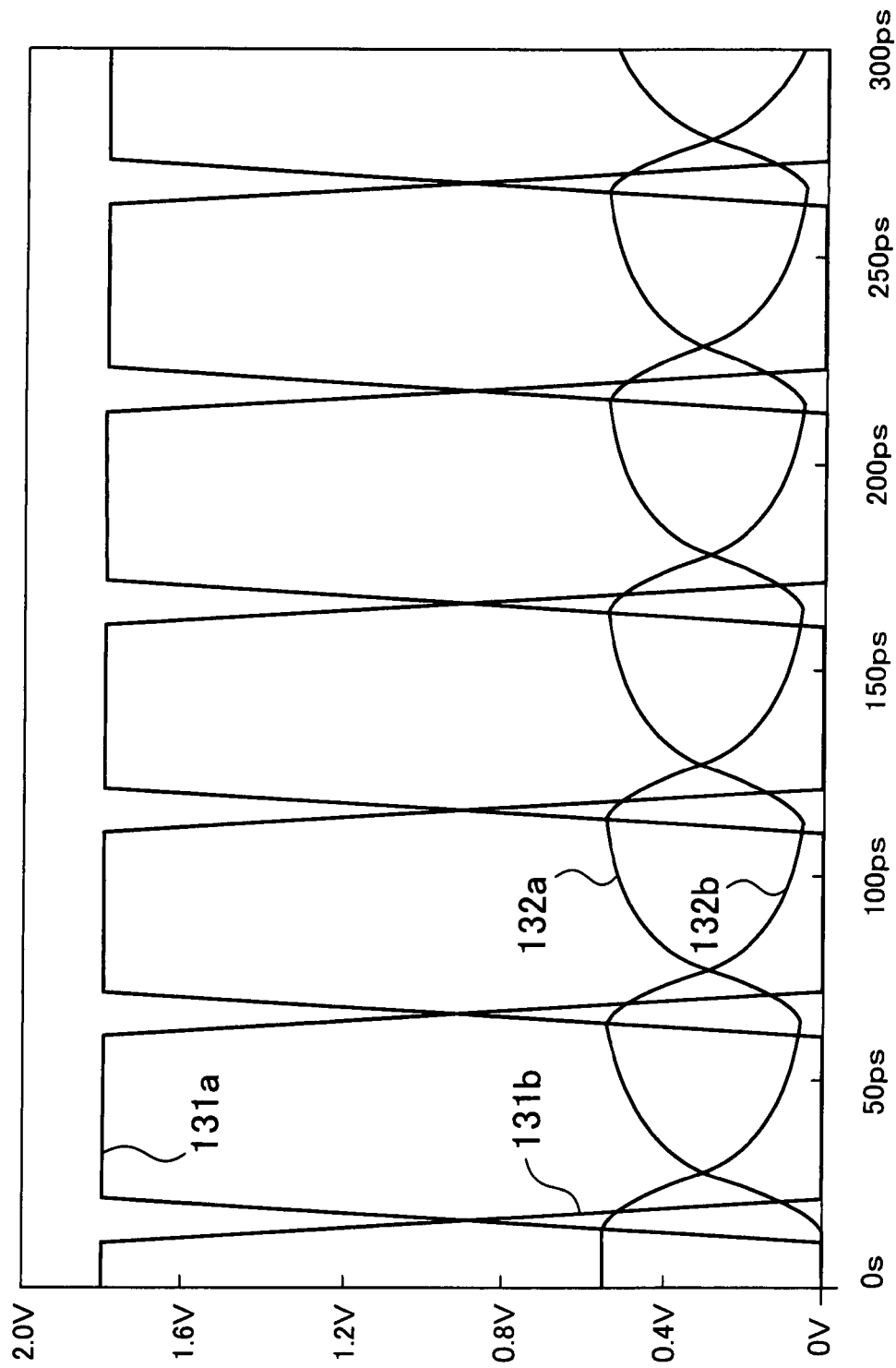
FIG. 18 shows simulation results in FIG. 17.

FIG. 18 shows simulation results in FIG. 17. FIG. 18 shows voltage waveforms 131a and 131b of the differential signals 121 and 122 input to the simulation circuit in FIG. 17 as well as shows voltage waveforms 132a and 132b at the points A and B in FIG. 17. In the circuit of FIG. 17, since each capacitance (the capacitors C41 to C48 in FIG. 17) of the transistors constituting the ESD protection circuit is large, the differential signal is delayed. As a result, the signal state transits to the next state before the state transition is completed.

Figure 19:
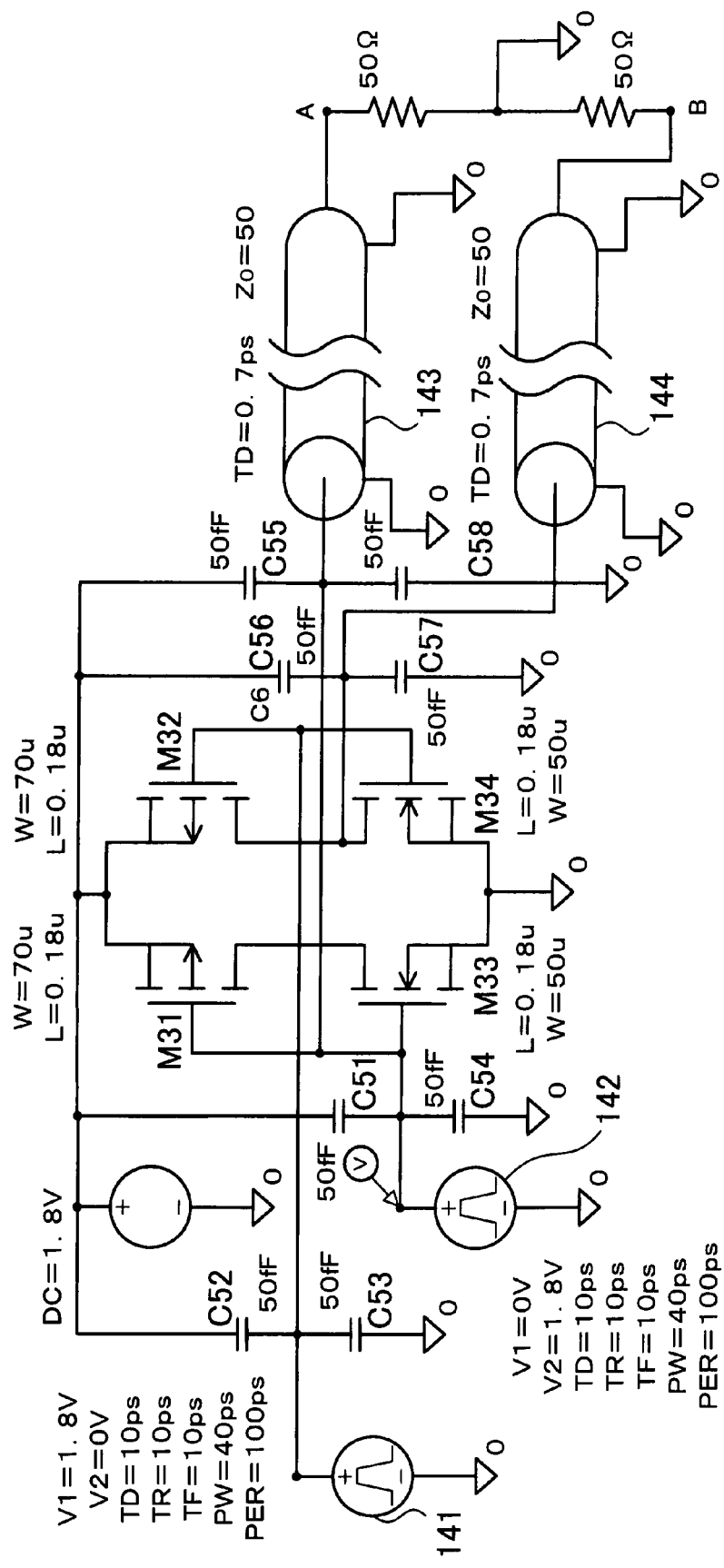
FIG. 19 shows a circuit for performing a simulation of differential signals in the case where a pair of transistors is formed in the same well.

FIG. 19 shows a circuit for performing a simulation of differential signals in the case where a pair of transistors is formed in the same well. In FIG. 19, capacitors C51 to C54 correspond to capacitances of the transistors M1 to M4 in FIG. 1. Capacitors C55 to C58 correspond to capacitances of the transistors M12 to M15 in FIG. 1. Transistors M31 to M34 correspond to the transistors M8 to M11 of the driver circuit 12. Transmission lines 143 and 144 correspond to the transmission lines 15a and 15b. Differential signals 141 and 142 represent signals for performing a simulation. Assume that the simulation is performed using parameters shown in FIG. 19. Each capacitance of the capacitors C51 to C58 is set to 50 fF as described above. The parameters in FIG. 19 have the same meaning as in FIG. 17 and the descriptions are omitted.

Figure 20:
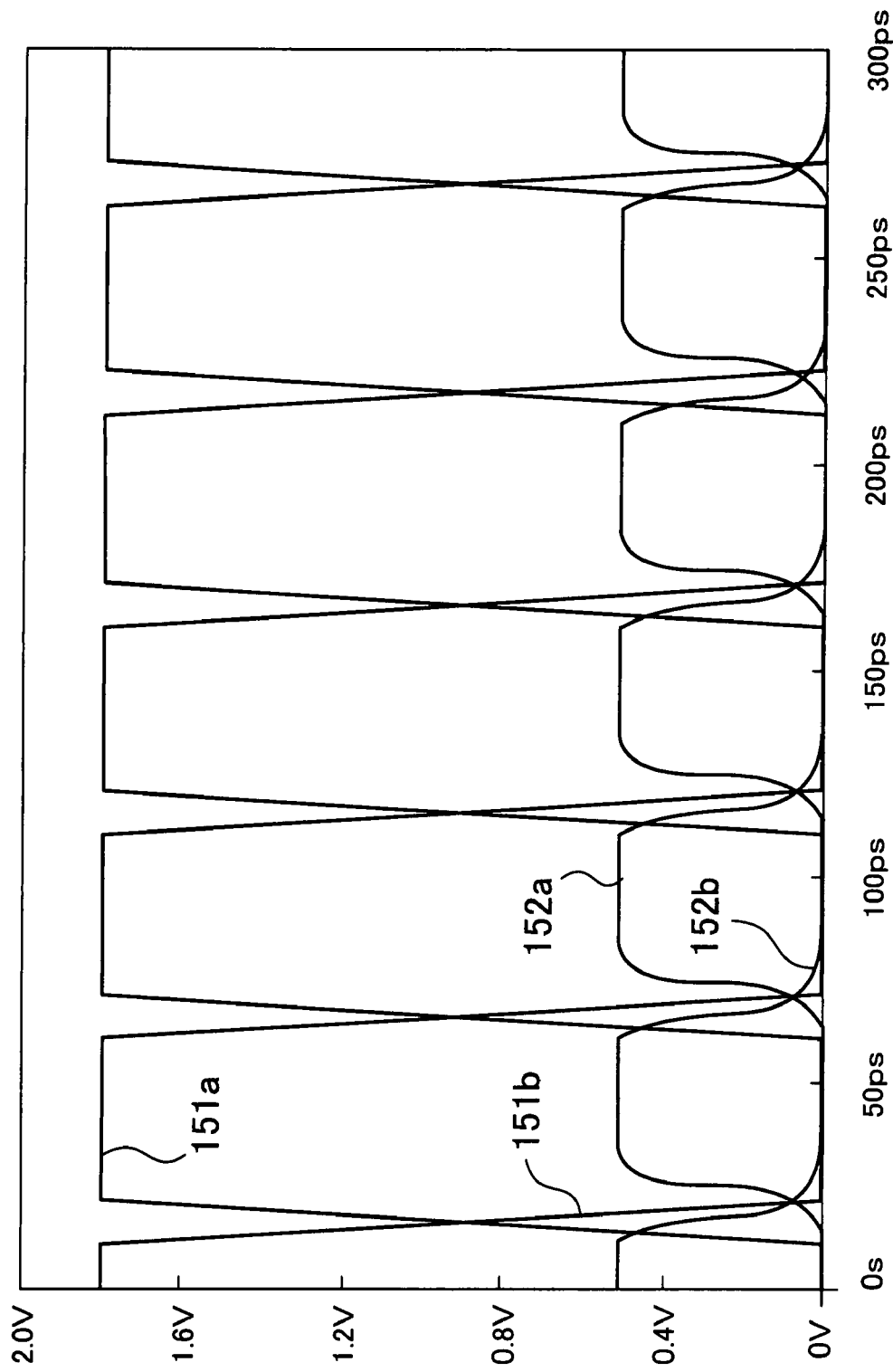
FIG. 20 shows simulation results in FIG. 19.

FIG. 20 shows simulation results in FIG. 19. FIG. 20 shows voltage waveforms 151a and 151b of the differential signals 141 and 142 input to the simulation circuit in FIG. 19 as well as shows voltage waveforms 152a and 152b at the points A and B in FIG. 19. In the circuit of FIG. 19, since each capacitance of the transistors constituting the ESD protection circuit is small, the differential signal is not delayed. As a result, the voltage becomes saturated before the state transition is completed.

Thus, each pair of transistors M1, M2, the transistors M3, M4, the transistors M12, M13 and the transistors M14, M15 for clamping the surge voltage is formed in the same well. Thereby, when differential signals transit, charges of the pair of transistors holding a state before the transition transfer within the same well. As a result, the capacitance of each pair of transistors M1, M2, transistors M3, M4, transistors M12, M13 and transistors M14, M15 is reduced with respective to the transition of the differential signals so that the speeding up of the differential signals can be realized.

Further, when the transmission lines 14a and 14b, and the transmission lines 15a and 15b are formed into a pair of transmission lines, the surge voltage can be effectively absorbed. Particularly, when the characteristic impedances of the branched transmission lines branched from the transmission lines 14a and 14b to the transistors M1 to M4 are made equal to or smaller than the characteristic impedances of the transmission lines 14a and 14b, the surge voltage can be effectively absorbed. Similarly, when the characteristic impedances of the branched transmission lines branched from the transmission lines 15a and 15b to the transistors M12 to M15 are made equal to or smaller than the characteristic impedances of the transmission lines 15a and 15b, the surge voltage can be effectively absorbed. Further, when the on-resistances of the transistors M1 to M4 are made equal to or smaller than the characteristic impedances of the transmission lines 14a and 14b, the surge voltage can be effectively absorbed. Similarly, when the on-resistances of the transistors M12 to M15 are made equal to or smaller than the characteristic impedances of the transmission lines 15a and 15b, the surge voltage can be effectively absorbed. Further, when each pair of transistors M1, M2, transistors M3, M4, transistors M12, M13 and transistors M14, M15 is connected to the power-supply VDD/ground pair transmission line having a characteristic impedance equal to or smaller than the on-resistance of the transistors, the surge voltage can be effectively absorbed.

Next, a second embodiment of the present invention will be described in detail with reference to the accompanying drawings. In the second embodiment, any transistor of the ESD protection circuit is constituted by an NMOS transistor.

Figure 21:
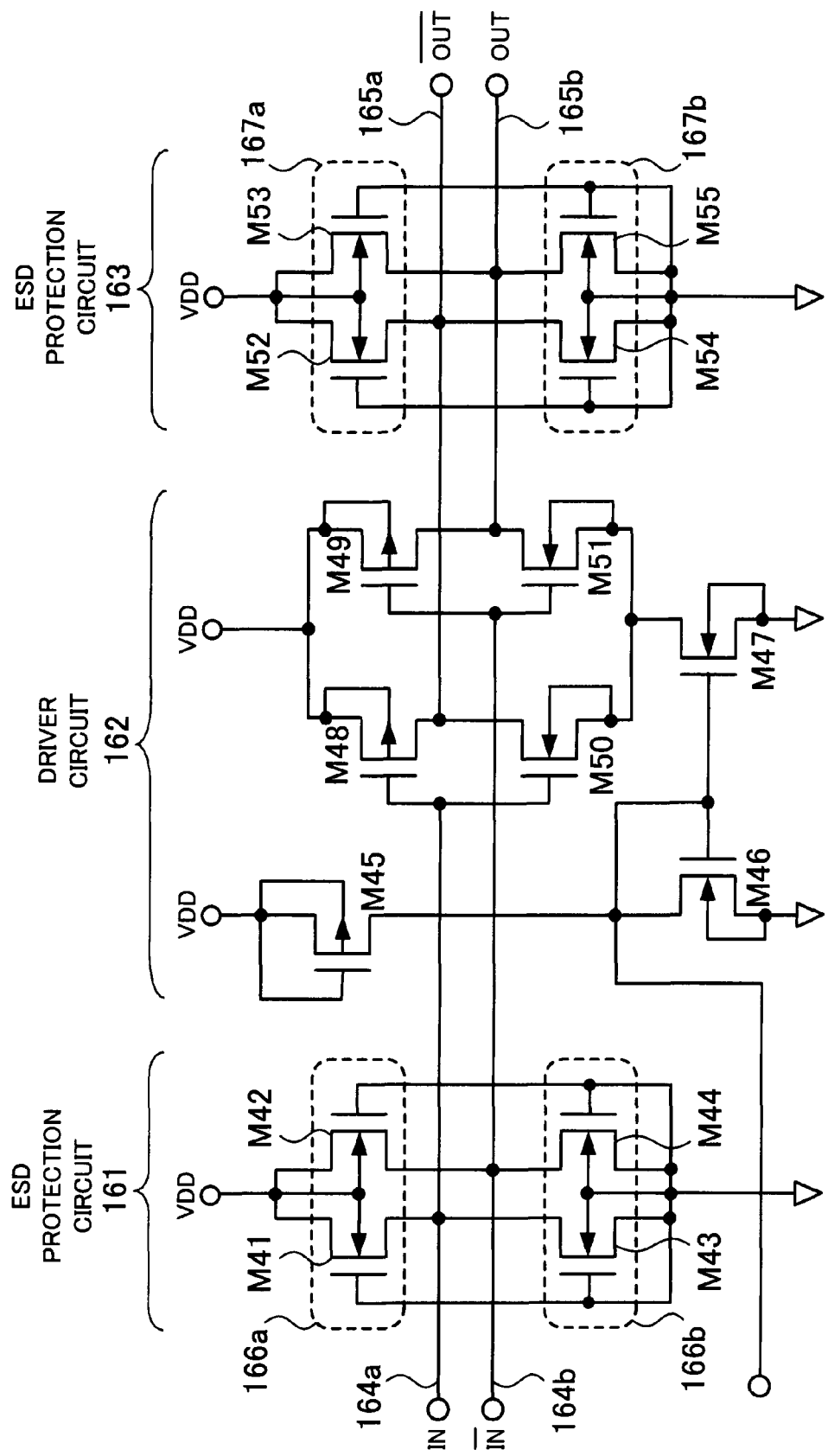
FIG. 21 is a circuit diagram of an LSI using an ESD protection circuit according to a second embodiment.

FIG. 21 is a circuit diagram of an LSI using an ESD protection circuit according to the second embodiment. As shown in FIG. 21, the LSI has ESD protection circuits 161 and 163, a driver circuit 162, transmission lines 164a, 164b, 165a and 165b, an IN terminal, an IN Bar terminal, an OUT terminal, and an OUT Bar terminal.

The ESD protection circuit 161 has a pair of transistors M41, M42 and a pair of transistors M43, M44. The pair of transistors M41, M42 and the pair of transistors M43, M44 correspond to the pair of transistors M1, M2 and the pair of transistors M3, M4 in the ESD protection circuit 11 in FIG. 1. However, there is a difference in that the transistors M41 and M42 are NMOS transistors. Further, there is a difference in that gates of the transistors M41 and M42 are connected to ground. The pair of transistors M41, M42 is formed in the same well and the pair of transistors M43, M44 is formed in the same well. The other connection relationships in FIG. 21 are the same as those in FIG. 1 and the detailed descriptions are omitted. In FIG. 21, a dotted line 166a indicates that the pair of transistors M41, M42 is formed in the same well, and a dotted line 166b indicates that the pair of transistors M43, M44 is formed in the same well.

The driver circuit 162 has the same circuit configuration as that of the driver circuit 12 in FIG. 1. Transistors M45 to M51 correspond to the transistors M5 to M11 in FIG. 1 and the detailed descriptions are omitted.

The ESD protection circuit 163 has a pair of transistors M52, M53 and a pair of transistors M54, M55. The pair of transistors M52, M53 and the pair of transistors M54, M55 correspond to the pair of transistors M12, M13 and the pair of transistors M14, M15 in the ESD protection circuit 13 in FIG. 1. However, there is a difference in that the transistors M52 and M55 are NMOS transistors. Further, there is a difference in that gates of transistors M52 and M53 are connected to ground. The pair of transistors M52, M53 is formed in the same well and the pair of transistors M54, M55 is formed in the same well. The other connection relationships in FIG. 21 are the same as those in FIG. 1 and the detailed descriptions are omitted. In FIG. 21, a dotted line 167a indicates that the pair of transistors M52, M53 is formed in the same well, and a dotted line 167b indicates that the pair of transistors M54, M55 is formed in the same well.

The transmission lines 164a, 164b, 165a and 165b are the same as the transmission lines 14a, 14b, 15a and 15b in FIG. 1 and the detailed descriptions are omitted.

Thus, any transistors M41 to M44 and M52 to M55 of the ESD protection circuits 161 and 163 may be constituted by an NMOS transistor.

Next, a third embodiment of the present invention will be described in detail with reference to the accompanying drawings. Also by a terminating resistor circuit connected to the transmission line, a delay of the differential signal is caused by a capacitance of the circuit. Therefore, in the third embodiment, by forming in the same well a pair of transistors constituting the terminating resistor circuit, a capacitance of the circuit is reduced with respect to the transition of the differential signal.

Figure 22:
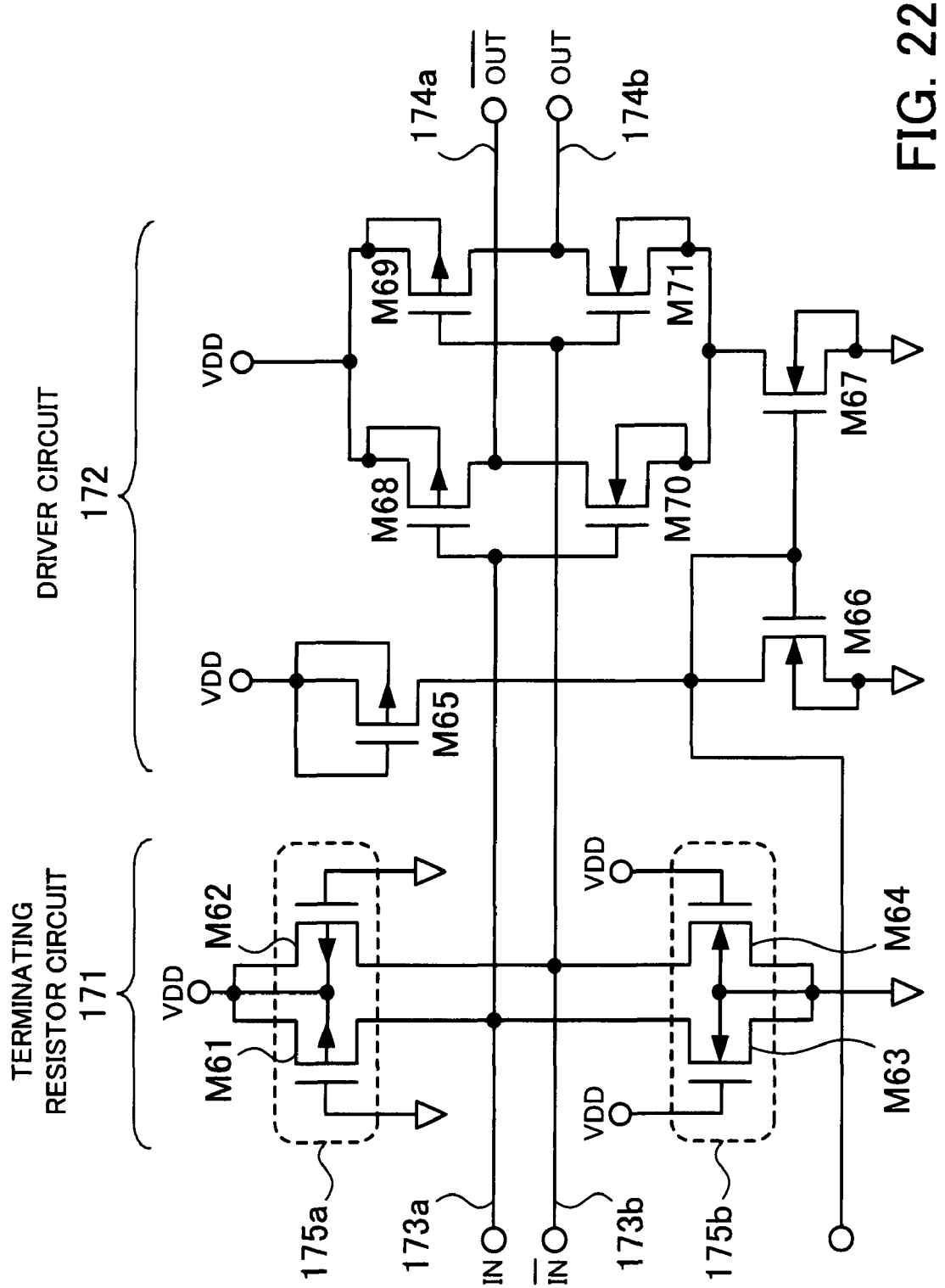
FIG. 22 is a circuit diagram of an LSI using a terminating resistor circuit according to a third embodiment.

FIG. 22 is a circuit diagram of an LSI using the terminating resistor circuit according to the third embodiment. As shown in FIG. 22, the LSI has a terminating resistor circuit 171, a driver circuit 172, transmission lines 173a, 173b, 174a and 174b, an IN terminal, an IN Bar terminal, an OUT terminal, and an OUT Bar terminal.

The terminating resistor circuit 171 has a pair of transistors M61, M62 and a pair of transistors M63, M64. Gates of the pair of transistors M61, M62 are connected to ground. Sources and back gates of the pair of transistors M61, M62 are connected to a power supply VDD. Drains of the pair of transistors M61, M62 are connected to the transmission lines 173a and 173b, respectively. Gates of the pair of transistors M63, M64 are connected to the power supply VDD. Sources and back gates of the pair of transistors M63, M64 are connected to ground. Drains of the pair of transistors M63, M64 are connected to the transmission lines 173a and 173b, respectively. The pair of transistors M61, M62 is formed in the same well and the pair of transistors M63, M64 is formed in the same well. The transistors M61 to M64 each have a resistance function and prevent reflection of the differential signals transmitted through the transmission lines 173a and 173b. In FIG. 22, a dotted line 175a indicates that the pair of transistors M61, M62 is formed in the same well, and a dotted line 175b indicates that the pair of transistors M63, M64 is formed in the same well.

The driver circuit 172 has the same circuit configuration as that of the driver circuit 12 in FIG. 1. The pair of transistors M65, M66 and the pair of transistors M70, M71 correspond to the pair of transistors M5, M6 and the pair of transistors M10, M11 in FIG. 1 and the detailed descriptions are omitted. The transmission lines 173a, 173b, 174a and 174b are the same as the transmission lines 14a, 14b, 15a and 15b in FIG. 1 and the detailed descriptions are omitted.

The transistors M61 to M64 constituting the terminating resistor circuit 171 each have a drain capacitance. Therefore, the differential signal transmitted through the transmission lines 173a and 173b is delayed. However, since each pair of transistors M61, M62 and transistors M63, M64 is formed in the same well, the drain capacitance is reduced with respect to the transition of the differential signal.

Thus, each pair of transistors M61, M62 and transistors M63, M64 for preventing reflection of the differential signals is formed in the same well. Thereby, when differential signals transit, charges of each pair of transistors M61, M62 and transistors M63, M64 holding a state before the transition transfer within the same well. As a result, the capacitances of the resistances are reduced with respect to the transition of the differential signals so that the speeding up of the differential signals can be realized.

Next, a fourth embodiment of the present invention will be described in detail with reference to the accompanying drawings. In the fourth embodiment, the transistors M61 to M64 shown in FIG. 22 are formed by a diffusion resistance.

Figure 23:
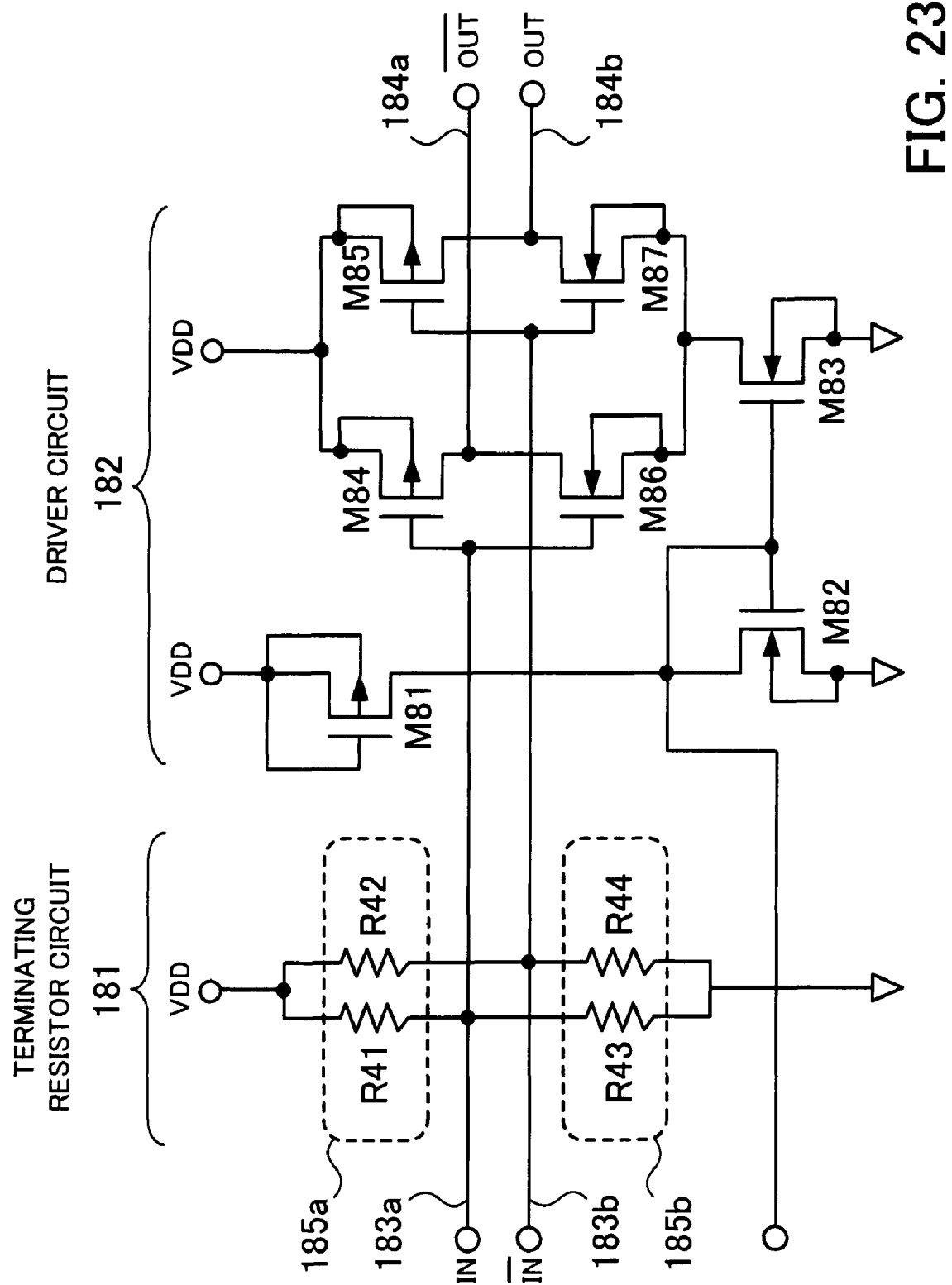
FIG. 23 is a circuit diagram of an LSI using a terminating resistor circuit according to a fourth embodiment.

FIG. 23 is a circuit diagram of an LSI using the terminating resistor circuit according to the fourth embodiment. As shown in FIG. 23, the LSI has a terminating resistor circuit 181, a driver circuit 182, transmission lines 183a, 183b, 184a and 184b, an IN terminal, an IN Bar terminal, an OUT terminal, and an OUT Bar terminal.

The terminating resistor circuit 181 has a pair of diffusion resistances R41, R42 and a pair of diffusion resistances R43, R44. One ends of the pair of diffusion resistances R41 and R42 are respectively connected to the transmission lines 183a and 183b, and the other ends thereof are respectively connected to the power supply VDD. One ends of the pair of diffusion resistances R43 and R44 are respectively connected to the transmission lines 183a and 183b, and the other ends thereof are respectively connected to ground.

The driver circuit 182 has the same circuit configuration as that of the driver circuit 12 in FIG. 1. Transistors M81 to M87 correspond to the transistors M5 to M11 in FIG. 1 and the detailed descriptions are omitted. The transmission lines 183a, 183b, 184a and 184b are the same as the transmission lines 14a, 14b, 15a and 15b in FIG. 1 and the detailed descriptions are omitted.

The diffusion resistances R41 to R44 constituting the terminating resistor circuit each have a capacitance in a diffusion layer of the resistance. Therefore, the differential signal transmitted through the transmission lines 183a and 183b is delayed. However, since each pair of diffusion resistances R41, R42 and diffusion resistances R43, R44 is formed in the same well, the drain capacitance is reduced with respect to the transition of the differential signal.

Thus, each pair of diffusion resistances R41, R42 and diffusion resistances R43, R44 for preventing reflection of the differential signal is formed in the same well. Thereby, when differential signals transit, charges of each pair of diffusion resistances R41, R42 and diffusion resistances R43, R44 holding a state before the transition transfer within the same well. As a result, the capacitances of the resistances are reduced with respect to the transition of the differential signals so that the speeding up of the differential signals can be realized.

In the electrostatic discharge protection circuit of the present invention, the pair of transistors for clamping electrostatic discharge is formed in the same well. Thereby, when differential signals transit, charges of the pair of transistors holding a state before the transition transfer within the same well. As a result, the capacitances of the transistors are reduced with respect to the transition of the differential signals so that the speeding up of the differential signals can be realized.

In the terminating resistor circuit of the present invention, the pair of resistances for preventing reflection of the differential signals is formed in the same well. Thereby, when differential signals transit, charges of the pair of resistances holding a state before the transition transfer within the same well. As a result, the capacitances of the resistances are reduced with respect to the transition of the differential signals so that the speeding up of the differential signals can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An electrostatic discharge protection circuit for protecting an internal circuit of a semiconductor device from electrostatic discharge, comprising:
   a pair of transistors connected to each of two lines which are connected to external terminals of the semiconductor device and through which differential signals propagate, the pair of transistors being formed in the same well so as to clamp the electrostatic discharge applied to the external terminals wherein the lines are constituted by a pair of transmission lines, and wherein characteristic impedances of branched transmission lines connected to the pair of transistors from the pair of transmission lines are equal to or smaller than characteristic impedances of the pair of transmission lines.

2. An electrostatic discharge protection circuit for protecting an internal circuit of a semiconductor device from electrostatic discharge, comprising:
   a pair of transistors connected to each of two lines which are connected to external terminals of the semiconductor device and through which differential signals propagate, the pair of transistors being formed in the same well so as to clamp the electrostatic discharge applied to the external terminals, wherein the lines are constituted by a pair of transmission lines, and wherein on-resistances of the pair of transistors are equal to or smaller than characteristic impedances of the pair of transmission lines.

3. An electrostatic discharge protection circuit for protecting an internal circuit of a semiconductor device from electrostatic discharge, comprising:

a pair of transistors connected to each of two lines which are connected to external terminals of the semiconductor device and through which differential signals propagate, the pair of transistors being formed in the same well so as to clamp the electrostatic discharge applied to the external terminals, wherein the pair of transistors are connected to a power supply/ground pair transmission line having a characteristic impedance equal to or smaller than on-resistances of the pair of transistors.

4. An electrostatic discharge protection circuit for protecting an internal circuit of a semiconductor device from electrostatic discharge, comprising:

a pair of transistors connected to each of two lines which are connected to external terminals of the semiconductor device and through which differential signals propagate, the pair of transistors being formed in the same well so as to clamp the electrostatic discharge applied to the external terminals, wherein a distance between drain diffusion regions of the pair of transistors is determined such that a transfer time of charges which transfer between the drain diffusion regions is shorter than a transition time of the differential signals.

5. An electrostatic discharge protection circuit for protecting an internal circuit of a semiconductor device from electrostatic discharge, comprising:

a pair of transistors connected to each of two lines which are connected to external terminals of the semiconductor device and through which differential signals propagate, the pair of transistors being formed in the same well so as to clamp the electrostatic discharge applied to the external terminals, wherein the pair of transistors clamps the electrostatic discharge to one or both of a power supply and ground, and wherein the pair of transistors for clamping the electrostatic discharge to the power supply are formed in the same well and another pair of transistors for clamping the electrostatic discharge to the ground are formed in the same well.

6. An electrostatic discharge protection circuit for protecting an internal circuit of a semiconductor device from electrostatic discharge, comprising:

a pair of transistors connected to each of two lines which are connected to external terminals of the semiconductor device and through which differential signals propagate, the pair of transistors being formed in the same well so as to clamp the electrostatic discharge applied to the external terminals, wherein in the pair of transistors, gates are formed in parallel, first sources and drains of the pair of transistors are formed on the side where the gates face to each other, and each second source of the pair of transistors is formed on the side opposite the first sources and the drains across each of the gates.

* * * * *